(12) United States Patent
Iwata et al.

(10) Patent No.: US 8,887,015 B2
(45) Date of Patent: Nov. 11, 2014

(54) APPARATUS AND METHOD FOR DESIGNING SEMICONDUCTOR DEVICE, AND SEMICONDUCTOR DEVICE

(75) Inventors: Hiroyuki Iwata, Kanagawa (JP); Jun Matsushima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 85 days.

(21) Appl. No.: 13/544,491

(22) Filed: Jul. 9, 2012

(65) Prior Publication Data

US 2013/0019134 A1    Jan. 17, 2013

(30) Foreign Application Priority Data

Jul. 15, 2011  (JP) ................................ 2011-156232

(51) Int. Cl.
G01R 31/28 (2006.01)
G06F 17/50 (2006.01)

(52) U.S. Cl.
CPC .......... *G06F 17/505* (2013.01); *G06F 2217/14* (2013.01)
USPC ............................ 714/726; 714/728; 714/739

(58) Field of Classification Search
CPC ................ G01R 31/318536; G01R 31/318541
USPC .......... 714/726, 728, 724, 725, 729, 738, 739
See application file for complete search history.

(56) References Cited

U.S. PATENT DOCUMENTS

| 5,613,146 A * | 3/1997 | Gove et al. ..................... 712/20 |
| 6,630,853 B1 | 10/2003 | Hamada |
| 6,795,948 B2 * | 9/2004 | Lin et al. ....................... 716/136 |
| 7,900,163 B2 * | 3/2011 | Weiner et al. ................. 716/136 |
| 2012/0331358 A1 * | 12/2012 | Itou ............................... 714/726 |

FOREIGN PATENT DOCUMENTS

| JP | 1-286609 A | 11/1989 |
| JP | 10-41789 A | 2/1998 |
| JP | 10-290143 A | 10/1998 |
| JP | 2004-56667 A | 2/2004 |
| JP | 2007-235501 A | 9/2007 |

* cited by examiner

*Primary Examiner* — Fritz Alphonse
(74) *Attorney, Agent, or Firm* — Foley & Lardner LLP

(57) ABSTRACT

An arithmetic processor executes analysis processing for analyzing a probability that an output value of the scan flip-flop circuit after the capturing operation becomes a given logical state, and scan chain structure processing for structuring a scan chain for a plurality of scan flip-flop circuits having the same degree of probability that the output value after the capturing operation becomes the given logical state, on the basis of a result of the analyzing processing. The scan chain lower in a transition probability during the scan operation is formed so that a power consumption during a scan test can be reduced.

11 Claims, 19 Drawing Sheets

APPARATUS AND METHOD FOR DESIGNING SEMICONDUCTOR DEVICE, AND SEMICONDUCTOR DEVICE

CROSS-REFERENCE TO RELATED APPLICATIONS

The disclosure of Japanese Patent Application No. 2011-156232 filed on Jul. 15, 2011 including the specification, drawings, and abstract is incorporated herein by reference in its entirety.

BACKGROUND

The present invention relates to a designing apparatus and a designing method for a semiconductor device including a scan flip-flop circuit that can switch between scanning operation and capturing operation, and the semiconductor device.

In order to enable a scanning test of a semiconductor integrated circuit (LSI) as an example of the semiconductor device, a flip-flop circuit (called "FF") in the circuit is replaced with an FF having a multiplexer (called "MUX") which is called "scan FF" to switch between a text input and an input of normal operation. The scan FF is configured to operate as a shift register (called "scan chain") that can be controlled from an external input/output. The scan chain is subjected to the shift operation (called "scan shift operation") so that an arbitrary test pattern can be set in the respective FFs. The logic of a control signal of the MUX is switched to take in an input from the normal operation (called "capture operation"). A value acquired in the capture operation is again subjected to the shift operation to output a response (called "unload"), and to conduct the application (called "load") of a subsequent test pattern. Thus, the scan test is conducted. The test pattern to be applied during the scanning operation is in a state substantially close to random. Therefore, in the FF during the scanning operation, a value transits with a probability of about 50%. The transition probability of 50% is considerably higher than that during the normal operation. Also, there is a need to operate all of the FFs during the scanning operation. For that reason, during the scanning test operation, a rate (called "activation rate") of the circuits causing logic transition as a whole under the influence of the transition of the value of the FF becomes higher, resulting in a tendency to consume an electric power larger than that during the normal operation.

In the FF, there has been known that the result of EX-ORing (exclusive OR) or EX-NORing (exclusive NOR) an output value and an input value, and a clock input are NANDed or ANDed, and when the same value is continuously applied, the clock mask is conducted to reduce the electric power (for example, refer to Japanese Patent Unexamined Application Publication No. Hei-1 (1999)-286609, Japanese Patent Unexamined Application Publication No. Hei-10 (2008)-41789, Japanese Patent Unexamined Application Publication No. Hei-10 (2008)-41789-290143, Japanese Patent Unexamined Application Publication No. 2007-235501, and Japanese Patent Unexamined Application Publication No. 2004-56667).

Also, there has been known a technique in which an output of EX-NORing the present value and an input value in a first latch of a D-type FF, and a clock are ORed, and an output of EX-ORing an input value and an output value of a second latch, and a clock are ANDed, and when the same value is continuously input to a D-terminal (input terminal), the clock mask is conducted to reduce a power consumption (for example, Japanese Patent Unexamined Application Publication No. 2004-56667).

SUMMARY

According to Japanese Patent Unexamined Application Publication No. Hei-1 (1999)-286609, Japanese Patent Unexamined Application Publication No. Hei-10 (2008)-41789, Japanese Patent Unexamined Application Publication No. Hei-10 (2008)-41789-290143, and Japanese Patent Unexamined Application Publication No. 2007-235501, a hold timing is close to an in-phase latch, and a variation of a value is not permitted in a period other than a period during which the clock is low level. A data terminal is prohibited from being transited in a period during which the clock is high level. If glitch (transition) occurs in the data terminal in the period where the clock is high level, the transition passes through an EX-OR gate, and arrives at a clock input terminal of an internal FF. As a result, because the glitched clock is input to the FF in a state where a value is varied in the data terminal, a value of the internal FF becomes unfixed. For example, in a circuit configuration illustrated in FIG. 24, as illustrated in FIG. 25, it is conceivable that the output logic becomes unfixed due to an influence of hazard. Also, in the circuit configuration, a probability that the logical value becomes 1 (or 0) is not taken into account.

According to Japanese Patent Unexamined Application Publication No. 2004-56667, when the same value is continuously applied to the input terminal, the clock mask is conducted to reduce the power consumption. In this case, the output does not become an unfixed value even if data is transited in the input terminal in the period during which the clock is high level.

However, according to Japanese Patent Unexamined Application Publication No. 2004-56667, because both of the EX-OR gate and an EX-NOR gate are used, an area overhead become larger. Also, in Japanese Patent Unexamined Application Publication No. 2004-56667, even if any one of the logical values 0 and 1 is continuously applied, masking is conducted, and the probability that the logical value becomes 1 (or 0) is not taken into account.

An object of the present invention is to provide a technique for reducing a power consumption taking a probability that a logical value of a scan flip-flop circuit becomes a given value into account.

The above and other objects and novel features of the present invention would be apparent from the description of the present specification and the attached drawings.

The typical features of the present invention disclosed in the present specification will be described in brief below.

That is, an arithmetic processor executes analysis processing that analyzes a probability that an output value of a scan flip-flop circuit after capture operation becomes a given logic state, and scan chain structure processing that structures the scan chain for each of a plurality of scan flip-flop circuits having a comparable probability that the output value after the capture operation becomes the given logical state, on the basis of the result of the analysis processing.

The advantages obtained by the typical features of the present invention disclosed in the present invention will be described below.

That is, there can be provided a technique for reducing the power consumption taking the probability that the logical value of the scan flip-flop circuit becomes a given value into account.

DETAILED DESCRIPTION

1. Outline of Embodiment

Figure 1:
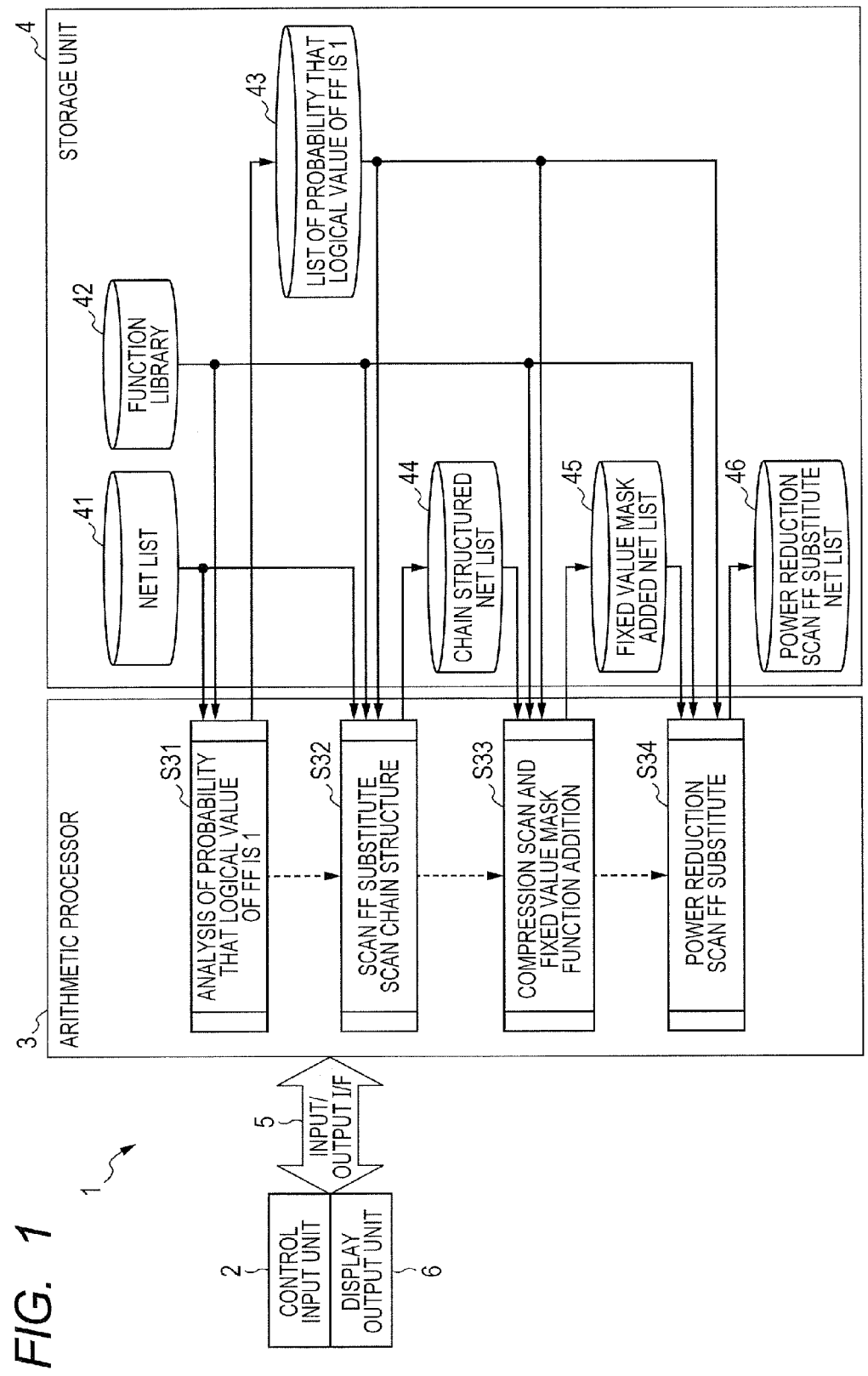
FIG. 1 is a block diagram illustrating a configuration example of a designing apparatus according to the present invention.

First, a description will be given of an outline of a typical embodiment of the present invention disclosed in the present application. Reference numerals or symbols in the drawings, which are referred to in brackets in the description of the outline of the typical embodiment, merely exemplify concepts of constituent elements indicated by the reference numerals or symbols.

(1) A method of designing the semiconductor device according to the typical embodiment of the present invention causes an arithmetic processor (3) to execute analysis processing (S31) for analyzing a probability that an output value of the scan flip flop after capturing operation becomes a given logical state, and scan chain structure processing (S32) for structuring a scan chain for each of a plurality of scan flip-flop circuits having a comparable probability that the output value after the capture operation becomes the given logical state, on the basis of the result of the analysis processing.

During the scanning operation, all of the FFs need to operate. For that reason, during the scan test operation, an activation rate of the logical circuit is increased under the influence of transition of the value of the FF, resulting in a tendency to consume a larger amount of electric power than that during the normal operation. Conversely, if a probability that the logic is transited (called "transition probability") can be reduced during the scanning operation, the power consumption can be suppressed as much. In the semiconductor device designing method according to the typical embodiment of the present invention, the scan chain is structured for each of the plurality of scan flip flop circuits having the comparable probability that the output value of the scan flip flop after capturing operation becomes the given logical state on the basis of the result of the analysis processing. The probability that the output value becomes the given logical state represents a probability that the logical value becomes 1 (or 0).

Now, let us consider, for example, a case structuring a first scan chain by the scan flip-flop circuit where the probability that the logical value becomes 1 is 50%, a second scan chain by the scan flip-flop circuit where the probability that the logical value becomes 1 is lower than 50%, and a third scan chain by the scan flip-flop circuit where the probability that the logical value becomes 1 is higher than 50%. The second scan chain by the scan flip-flop circuit where the probability that the logical value becomes 1 is lower than 50% corresponds to a scan chain by the scan flip-flop circuit where the probability that the logical value becomes 0 is higher than 50%.

The second scan chain and the third scan chain are low in the transition probability during the scanning operation as compared with the first scan chain. For that reason, the power consumptions in the second scan chain and the third scan chain are lower than the power consumption in the first scan chain.

Thus, the scan chain is structured for each of the plurality of scan flip flop circuits having the comparable probability that the output value becomes the given logical state to form the scan chain where the transition probability during the scanning operation is decreased. As a result, the power consumption during the scan test can be reduced.

(2) In the above item (1), the arithmetic processor can execute a fixed value masking function addition processing (S33) for adding a maskable mask control logic to the logical value higher in the probability provided to the scan flip-flop circuit included in each scan chain after the capturing operation, on the basis of information on the probability that each scan flip-flop circuit configuring the scan chain becomes the given logical state after the above scan chain structure processing has been executed by the above arithmetic processor. With the addition of a fixed value masking function corresponding to the value higher in the probability after the capturing operation of the FF included in each scan chain, there is a high probability that the values of the FFs in each scan chain have the same value over shift-in (load) of a test pattern and shift-out (unload) of a capture value. As a result, since the transition probability during the scan test operation can be reduced, the power consumption during the scan test can be reduced.

(3) In the above item (2), the arithmetic processor can execute a substitution processing (S34) for substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the compression scan addition processing has been executed by the arithmetic processor. The substitution of the scan flip-flop circuit that can reduce the electric power is effective in obtaining the power reduction effect. Also, in the scan flip-flop circuit that can reduce the electric power by enabling the clock mask when a logical value higher in the probability provided to the scan flip-flop circuit included in each scan chain after the capturing operation is continuously input, the probability of the scan flip-flop circuit included in each scan chain after the capturing operation is limited to 1 or 0 in the logical value. The above logical configuration is simplified so that the masking is conducted even if any one of the logical values 0 and 1 is continuously applied, as compared with a case using the EX-OR gate and the EX-NOR gate. Therefore, the area overhead can be reduced.

(4) In the above item (3), the arithmetic processor can execute processing (S40) for inserting a test point circuit that can control the probability that the output value of the scan flip-flop circuit after the capturing operation becomes the given logical state. With the insertion of the test point circuit, the probability that the FF has the logical value of 1 can be changed.

(5) In the above item (1), the arithmetic processor can execute substitution processing (S34) for substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the scan chain structure processing has been executed by the arithmetic processor.

(6) A designing apparatus (1) according to a typical embodiment of the present invention includes an arithmetic processor (3) that can execute given processing according to a predetermined program. The arithmetic processor executes: analysis processing (S31) for analyzing a probability that an output value of the scan flip-flop circuit after the capturing operation becomes a given logical state; and scan chain structure processing (S32) for structuring a scan chain for a plurality of scan flip-flop circuits having the same degree of probability that the output value after the capturing operation becomes the given logical state, on the basis of a result of the analysis processing. As described above, the scan is structured every plural scan flip-flop circuits having the same degree of probability that the output value becomes the given logical state whereby the scan chain low in the transition probability during the scan operation is formed so that the power consumption during the scan test can be reduced.

(7) In the above item (6), the arithmetic processor executes fixed value masking function addition processing for adding a maskable mask control logic (175) to a logical value higher in the probability provided to the scan flip-flop circuit included in each scan chain after the capturing operation, on the basis of information on the probability that each scan flip-flop circuit configuring the scan chain becomes the given logical state after the scan chain structure processing has been executed. With the addition of the fixed value masking function corresponding to the value higher in the probability provided to the FFs included in each scan chain after the capturing operation, the probability that the values of the FFs in each scan chain have the same value over the shift-in (load) of the test pattern and the shift-out (unload) is high. As a result, the transition probability during the scan test operation can be reduced, and therefore the power consumption during the scan test can be reduced.

(8) In the above item (7), the arithmetic processor executes substitution processing for substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the compression scan addition processing has been executed. The substitution of the scan flip-flop circuit that can reduce the electric power is effective in obtaining the power reduction effect. Also, in the scan flip-flop circuit that can reduce the electric power by enabling the clock mask when a logical value higher in the probability provided to the scan flip-flop circuit included in each scan chain after the capturing operation is continuously input, the probability of the scan flip-flop circuit included in each scan chain after the capturing operation is limited to 1 or 0 in the logical value. The above logical configuration is simplified so that the masking is conducted even if any one of the logical values 0 and 1 is continuously applied, as compared with a case using the EX-OR gate and the EX-NOR gate. Therefore, the area overhead can be reduced.

(9) In the above item (6), the arithmetic processor executes substitution processing for substituting the scan flip-flop circuit with a scan flip-flop circuit (183, 184) that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the scan chain structuring processing has been executed. The substitution of the scan flip-flop circuit that can reduce the electric power is effective in obtaining the power reduction effect.

(10) A semiconductor device (170) according to a typical embodiment of the present invention includes a scan flip-flop circuit that can switch between scanning operation and capturing operation. In this case, a scan chain (171, 172) is structured for a plurality of scan flip-flop circuits having the same degree of probability that an output value of the scan flip-flop circuit after the capturing operation becomes a given logical state. As described above, the scan chain is structured every plural scan flip-flop circuits having the same degree of probability that the output value becomes the given logical state whereby the scan chain low in the transition probability during the scan operation is formed so that the power consumption during the scan test can be reduced.

(11) In the above item (10), a maskable mask control logic (175) can be provided in a logical value higher in the probability provided to the scan flip-flop circuit included in each scan chain after the capturing operation. With masked with the logical value higher in the probability provided to the scan flip-flop circuits included in each scan chain after the capturing operation, the probability that the values of the FFs in each scan chain have the same value over the shift-in (load) of the test pattern and the shift-out (unload) is high. As a result, the transition probability during the scan test operation can be reduced, and therefore the power consumption during the scan test can be reduced.

(12) In the above item (11), there can be provided a scan flip-flop circuit (183, 184) that can reduce an electric power by enabling a clock mask when a logical value higher in the probability of the scan flip-flop circuit included in each scan chain after the capturing operation is continuously input. The provision of the scan flip-flop circuit that can reduce the electric power is effective in the power reduction effect.

(13) In the above item (12), there can be provided a test point circuit (231 to 233, 237 to 239) that can control the probability that the output value of the scan flip-flop circuit after the capturing operation becomes the given logical state. With the insertion of the test point circuit, the probability that the FF has the logical value of 1 can be changed.

2. Details of Embodiments

Embodiments will be described in more detail.

First Embodiment

FIG. 1 illustrates a configuration example of a designing apparatus according to the present invention.

A designing apparatus 1 illustrated in FIG. 1 can design a net list that enables a low-power scan test. The designing apparatus 1 includes a control input unit 2, a display output unit 6, an input/output I/F (interface) unit 5, an arithmetic processor 3, and a storage unit 4. The control input unit 2 is a general name of a device for allowing an operator to control the control input unit 2 and the storage unit 4, and exemplified by a keyboard or a mouse. The display output unit 6 is configured to confirm the operation of the arithmetic processor 3 and the storage unit 4, and exemplified by a liquid crystal display. The control input unit 2 includes a CPU (central processing unit) having a function of executing a program necessary for semiconductor design to execute respective functional processes necessary for design of the LSI, and a peripheral device thereof. The storage unit 4 is formed of a storage medium such as a hard disc or a semiconductor memory which saves information on a library or a net list used for design of the LSI. With the execution of a given program, the control input unit 2 conducts various processing such as analysis processing S31 of a probability that the FF has a logical value of 1, scan FF substitution and scan chain structure processing S32, compression scan and fixed value mask addition processing S33, and power reduction scan FF substitution processing S34. In the analysis processing S31 of a probability that the FF has a logical value of 1, the probability that the output value of the scan flip-flop circuit after the capturing operation becomes a given logical state such as the logical value 1 is analyzed with reference to a net list 41 and a functional library 42 within a storage unit 4. The analysis result is stored in the net list 41 as a probability list 43 of the probability that the FF has the logical value of 1. In the scan FF substitution and scan chain structure processing S32, the substitution of the scan FF, and the structure of the scan chain for each of the plural scan FFs having the same degree of probability as the probability that the logical value is 1 are conducted with reference to the net list 41, the functional library 42, and the probability list 43 of the probability that the FF has the logical value of 1 within the storage unit 4. The structure result of the scan chain is stored in the storage unit 4 as a chain structured net list 44. In the compression scan and fixed value mask addition processing S33, the maskable compression scanning circuit is added to the logical value higher in the probability provided to the scan flip-flop circuit included in each scan chain after the capturing operation with reference to the net list 41, the functional library 42, the probability list 43 of the probability that the FF has the local value of 1 within the storage unit 4. The result of the compression scan and fixed value mask addition processing S33 is stored in the storage unit 4 as a fixed value mask added net list 45. In the power reduction scan FF substitution processing S34, there is conducted processing for substituting the scan flip-flop circuit with the scan flip-flop circuit that can reduce the power by enabling the clock mask when the logical value higher in the probability provided to the scan flip-flop circuit included in each scan chain after the capturing operation is continuously input with reference to the net list 41, the functional library 42, the probability list 43 of the probabilities that the FF has the local value of 1 within the storage unit 4. This substitution processing results are stored in the storage unit 4 as a power reduction scan FF substituted net list 46.

Subsequently, the detail of the above respective processing will be described.

Figure 2:
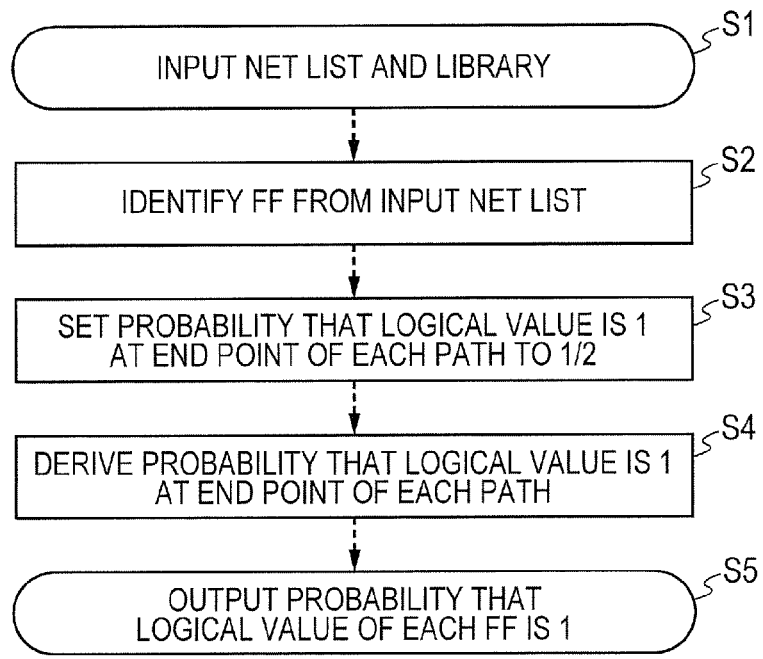
FIG. 2 is a flowchart illustrating main processing in the designing apparatus illustrated in FIG. 1.

FIG. 2 illustrates a flow of the analysis processing S31 of the probability that the FF has a logical value of 1.

The probability that each FF has the logical value of after the capturing operation is analyzed. The analysis result is used when structuring the scan chain. The information on the probability that each FF has the logical value of 1 is created in such a procedure that the net list 41 and the functional library 42 are set as input data (S1), the FF is identified from the input net list 41 (S2), the probability that a start point of each path has the logical value of 1 is set to ½ (S3), and the probability that an end point of each path has the logical value of 1 is calculated (S4).

If the probability that the input terminal of each logical gate has the logical value of 1 is determined, the probability that the output terminal of the gate has the logical value of 1 can be obtained according to the logic. Because the value set in each FF at the time of the scan test is substantially random, the probability that the value set for the output of each FF after the scan test has been completed becomes 1 can be regarded as ½. Also, it is assumed that the logical value is set to 1 with the probability of ½ in an open path. Under the circumstances, the probability that the start point (data output terminal of FF and start point of open path) of the identified net list has the logical value of 1 is set to ½, and the probability that the end point (input terminal of FF) of the path passing through the logical circuit has the logical value of 1 is calculated. The probability that the end point (data input terminal of FF) of the path has the logical value of 1 is the probability that each FF has the logical value of 1 after the capturing operation.

Figure 3:
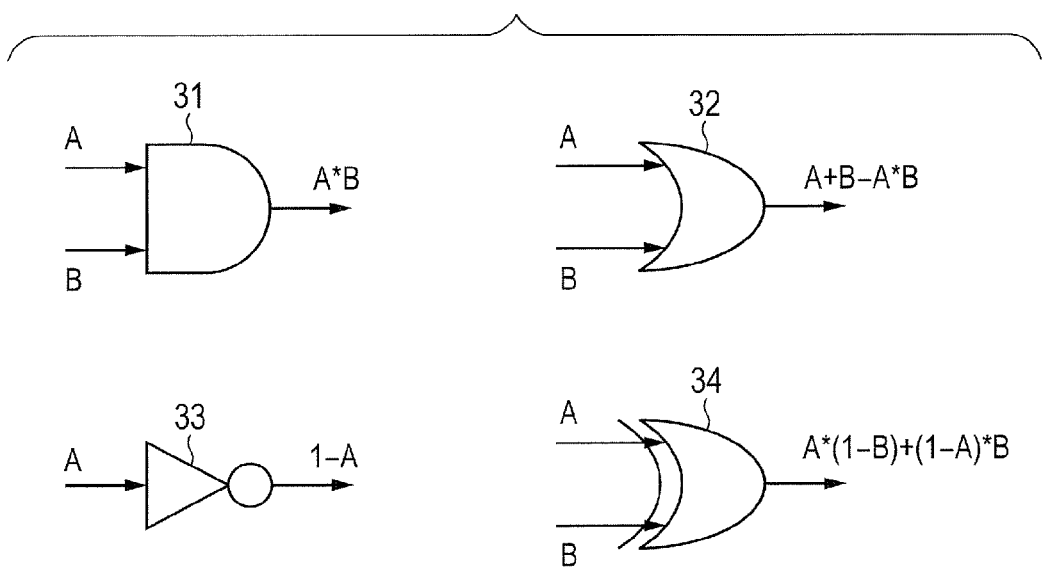
FIG. 3 is an illustrative view illustrating a probability that a logical value of an output side of each logical gate becomes 1 in correspondence with a probability that the logical value of an input side thereof becomes 1 becomes 1.

FIG. 3 illustrates the probability that the output side has the logical value of 1 in correspondence with the probability that the input side of each logical gate has the logical value of 1.

In a two-input AND gate 31, if the probabilities that the respective input terminals have the logical values of 1 are A and B, the probability that an output terminal thereof has the logical value of 1 must be "A*B" because the two input terminals have the logical values of 1 at the same time. Symbol "*" represents multiplication. Likewise, in a two-input OR gate 32, when the probabilities that the respective input terminals have the logical values of 1 are A and B, the probability that an output terminal thereof has the logical value of 1 is "A+B−A*B". In the case of a NOT gate 33, because the value is inverted, if the probability that the input terminal has the logical value of 1 is A, the probability that the output terminal has the logical value of 1 is "1−A". In an EX-OR gate 34, if the probabilities that the respective input terminals have the logical values of 1 are A and B, the probability that an output terminal thereof has the logical value of 1 is "A*(1−B)+(1−A)*B".

Figure 4:
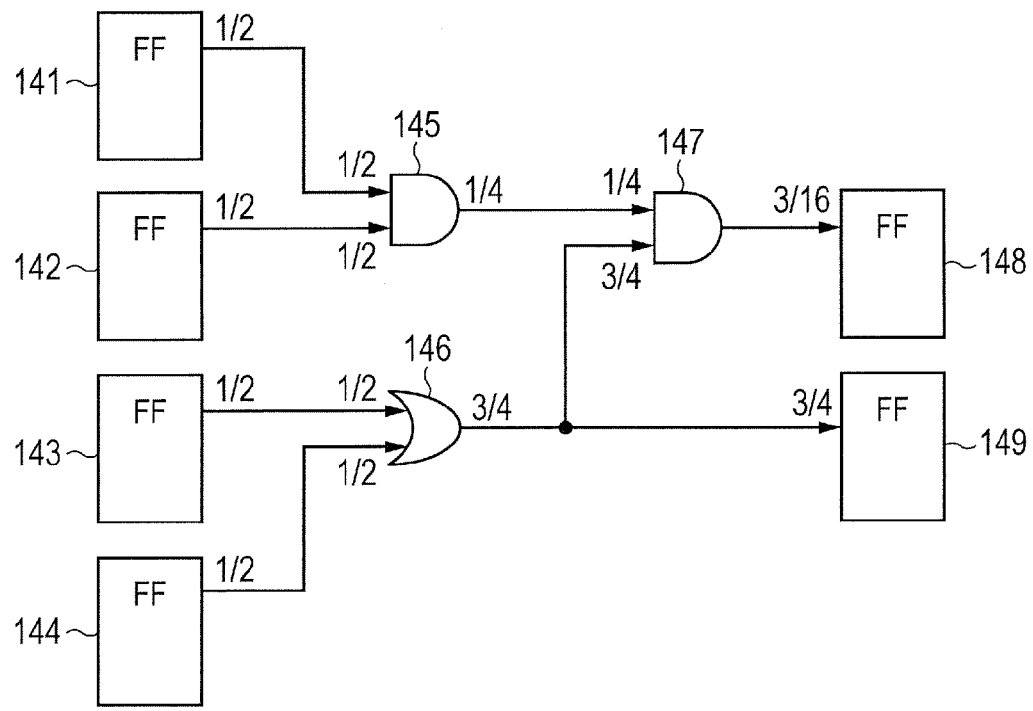
FIG. 4 is an illustrative view of a probability that the logical value of a main portion in the semiconductor device including an FF becomes 1.

FIG. 4 illustrates an example in which the probability that the output terminal of each FF has the logical value of 1 is set to ½, and the probability that the input terminal of the FF has the logical of 1 is calculated, on the basis of calculation expressions of the probabilities illustrated in FIG. 3.

The probability that an output of an AND gate 145, which arrives directly from FFs 141 and 142, has the logical value of 1 is ¼. The probability that an output of an OR gate 146, which arrives directly from FFs 143 and 144, has the logical value of 1 is ¾. Under the above influence, an AND gate 147 has input terminals, which are coupled to signal lines having the probabilities of ¼ and ¾ being the logical value of 1, and the probability that an output (input of FF 148) of the AND gate 147 has the logical value of 1 is 3/16.

Figure 5:
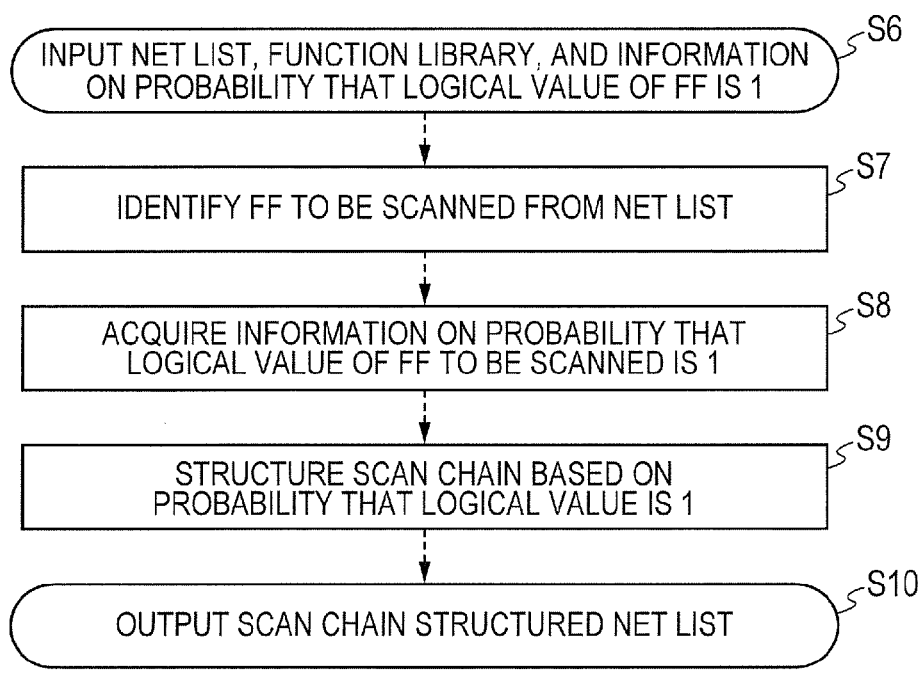
FIG. 5 is a flowchart illustrating main processing in the designing apparatus illustrated in FIG. 1.

FIG. 5 illustrates a flow of scan FF substitution and scan chain structure processing S32.

The net list 41, the functional library 42, and the probability list 43 of the probabilities that the FF has the logical value of 1 are input to the arithmetic processor 3 (S6). The FF to be scanned is identified from the net list 41 (S7) to acquire probability information on the probabilities that the FF to be scanned has the logical value of 1 (S8). The scan chain is structured by an assembly of the FFs having the same degree of probability that the logical value is 1 (S9) to output a scan chain structured net list 44 (S10).

Figure 6:
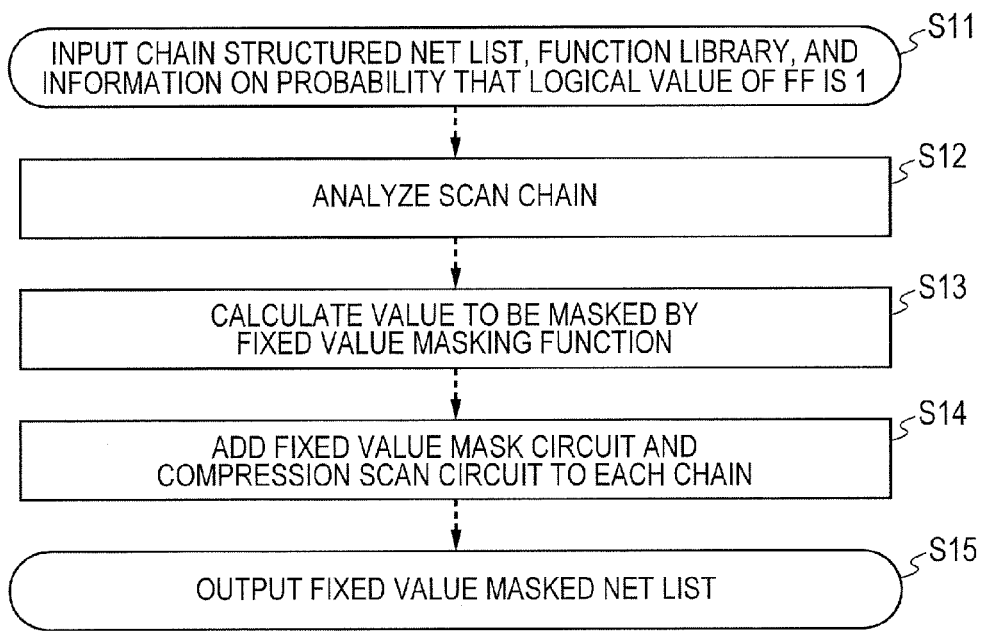
FIG. 6 is a flowchart illustrating the main processing in the designing apparatus illustrated in FIG. 1.

FIG. 6 illustrates a flow of the compression scan and fixed value mask addition processing S33.

The compression scan and fixed value mask addition processing S33 is added with a fixed value masking circuit that enables a fixed value mask of 0 or 1 corresponding to a value higher in the probability provided to the FF included in each scan chain after the capturing operation, by using the probability information on the probability that the FF has the logical value of 1, and a compression scanning circuit for conducting the compression scan. The generation of the fixed value mask added net list is conducted in the following procedure with the input of the information on the chain structured net list 44, the functional library 42, and the probability list 43 on the probability that the FF has the logical value of 1.

First, the scan FF included in the scan chain is identified from the input net list 41, and the probability of being the logical value of 1 is associated with the identified scan FF (S12). Then, the value higher in the probability provided to the FF configuring the scan chain after the capturing operation is set as a mask value in the fixed value mask for each scan chain so that the activation rate caused by a load at the time of scan test is reduced (S13). For example, in the scan chain including a large number of scan FFs having the high probability that the logical value is 0 with the value of the fixed value mask as 1, the value of the fixed value mask is set to 0. Then, the fixed value masking circuit and the compression scanning circuit are added to each of the san chains (S14) to output the value mask added net list 45. In this example, the compression scanning circuit includes a pattern generator for generating the test pattern to be supplied to the scan chain, and a pattern compressor for compressing the test pattern data output from the scan chain to output the data. Also, the fixed value masking circuit includes a mask control logic that supplies a given mask value (logical value 1 or 0) to the scan chain instead of the output of the pattern generator to output a given mask value from the scan chain.

Figure 7:
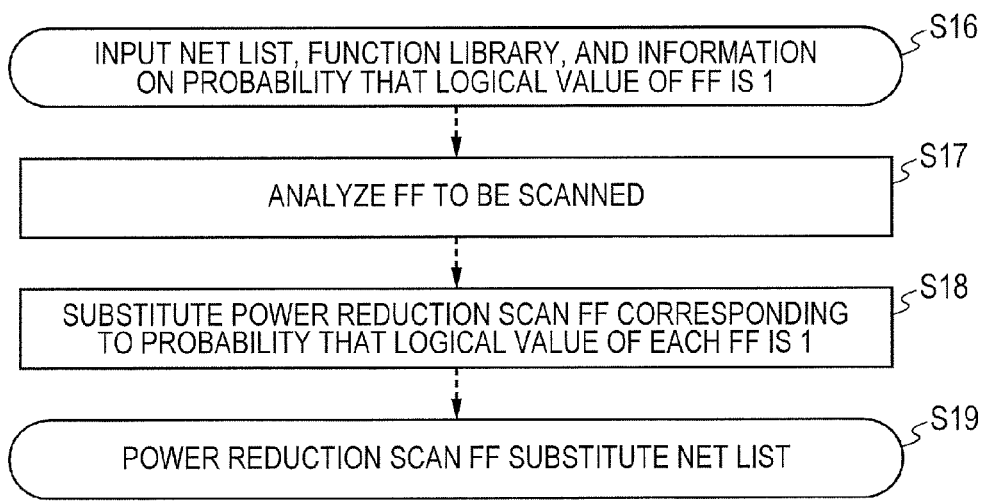
FIG. 7 is a flowchart illustrating the main processing in the designing apparatus illustrated in FIG. 1.

FIG. 7 illustrates a flow of the power reduction scan FF substitution processing S34.

First, the value mask added net list 45, the functional library 42, and the probability list 43 of the probabilities that the FF has the logical value of 1 are input to the arithmetic processor 3 (S16). The input net list assumed in this example has no restriction on the presence or absence of the scan chain structure, and the presence or absence of the addition of the fixed value masking function. Because the substitution of the power reduction scan FF is conducted according to the information on the probability that each FF has the logical value of 1, the substitution of the power scan FF is enabled even in the net list at any stage. The power scan FF substituted scanned net list is created in the following procedure with the input of the net list, the functionary library, and the information on the probabilities that the FF has the logical value of 1.

The FF to be scanned is identified by the input net list (S17). If the input net list has been subjected to the scan chain structure, the scan FF is identified by a chain trace. Each of the identified FFs to be scanned are substituted with the scan FF that can reduce the electric power only when any value of 0 or 1 corresponding to the value higher in the probability provided to the FF is continuously applied on the basis of the information on the probability that each FF has the logical value of 1 (S18). Then, the power reduction scan FF substituted net list is output (S19).

Second Embodiment

Figure 8:
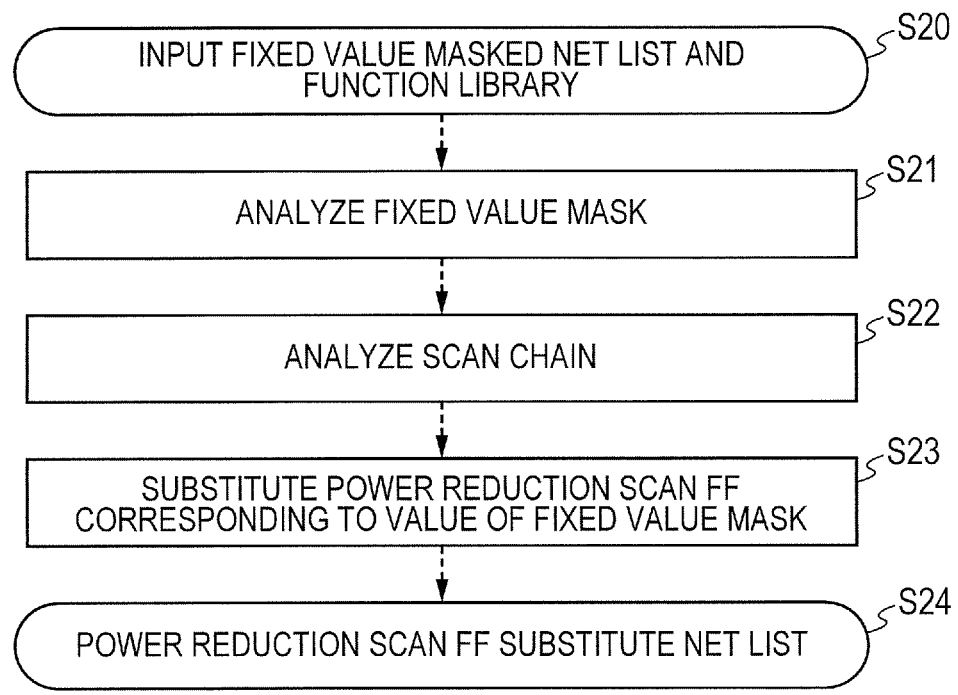
FIG. 8 is a flowchart illustrating the main processing in the designing apparatus illustrated in FIG. 1.

FIG. 8 illustrates another flow of the power reduction scan FF substitution processing S34.

In the power reduction scan FF substitution processing S34 illustrated in FIG. 8, the FF is substituted with the scan FF that can reduce the electric power only when any value of 0 or 1 corresponding to the value set by the fixed value mask is continuously applied, from the configuration of the fixed value masking function.

First, the value mask added net list 45 and the functional library 42 are input to the arithmetic processor 3 (S20). The type of the power reduction scan FF to be substituted is analyzed according to the value of the fixed value mask for each scan chain (S17). That is, it is discriminated whether the scan FF can reduce the electric power only when the logical value of 0 is continuously applied, or only when the logical value of 1 is continuously applied. For that reason, the probability list 43 of the probabilities that the FF has the logical value of 1 is not required as the input information. Then, the FF is substituted with the scan FF that can reduce the electric power only when a value corresponding to the value of the fixed value mask is continuously applied (S23) to output the power reduction scan FF substituted net list 46 (S24).

Third Embodiment

Figure 9:
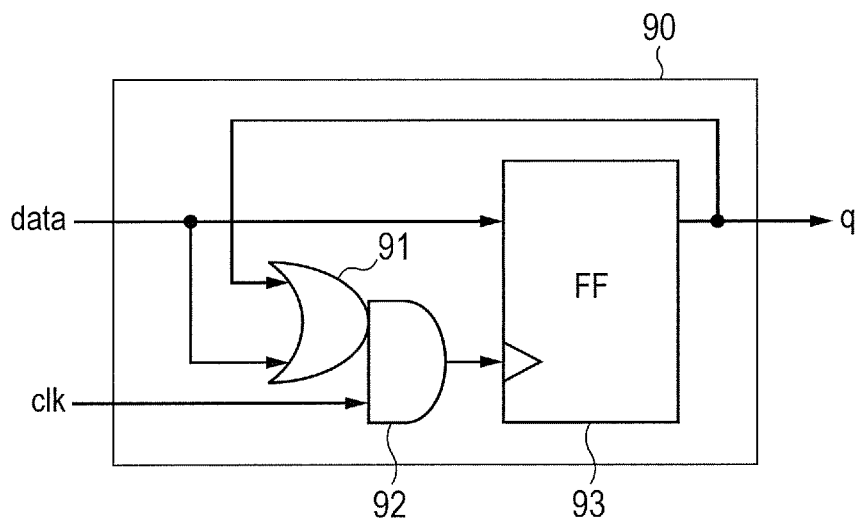
FIG. 9 is a circuit diagram illustrating a configuration example of the FF that can reduce a power only when the logical value 0 is continuously applied.

FIG. 9 illustrates a circuit example of the FF that can reduce the electric power only when the logical value of 0 is continuously applied.

In an FF 90 illustrated in FIG. 9, an OR gate 91 and an AND gate 92 are arranged upstream of an internal FF 93. The OR gate 91 ORs a logical value of a data output terminal of the internal FF 93 and a logical value of a data input terminal of the internal FF 93. The AND gate 92 ANDs an output of the OR gate 91 and a clock clk. An output of the AND gate 92 is transmitted to a clock input terminal of the internal FF 93. As a result, the output value of the OR gate 91 has the logical value of 0 only when a current output q has the logical value of 0, and an input has the logical value of 0 (that is, when the logical value of 0 is continuously applied), and the clock mask is enabled. In other words, the output q remains the logical value of 0 although the clock clk is input, and no logical change occurs. For that reason, the power consumption in the FF 90 can be suppressed when the logical value of 0 is continuously applied.

Figure 10:
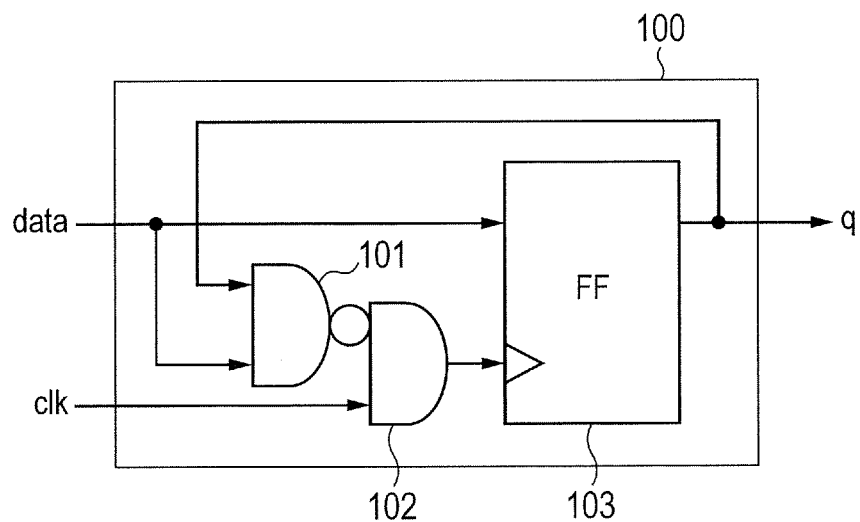
FIG. 10 is a circuit diagram illustrating a configuration example of the FF that can reduce a power only when the logical value 1 is continuously applied.

FIG. 10 illustrates a circuit example of the FF that can reduce the electric power only when the logical value of 1 is continuously applied.

In an FF 100 illustrated in FIG. 10, a NAND gate 101 and an AND gate 102 are arranged upstream of an internal FF 103. The NAND gate 101 NANDs a logical value of a data output terminal of the internal FF 103 and a logical value of a data input terminal of the internal FF 103. The AND gate 102 ANDs an output of the NAND gate 101 and a clock clk. An output of the AND gate 102 is transmitted to a clock input terminal of the internal FF 103. As a result, the output value of the NAND gate 101 has the logical value of 1 only when a current output q has the logical value of 1, and an input has the logical value of 1 (that is, when the logical value of 1 is continuously applied), and the clock mask is enabled. In other words, the output q remains the logical value of 1 although the clock clk is input, and no logical change occurs. For that reason, the power consumption in the FF 100 can be suppressed when the logical value of 1 is continuously applied.

In general, the FF consumes the electric power only when the clock is input to the FF. For that reason, the current value is compared with the input value, and if those values are identical, the clock input to the FF is masked to enable the power reduction. According to the related art, with the use of the EX-OR gate as the power reduction FF, even if any one of the logical values 0 and 1 is continuously applied, the clock mask is conducted to reduce the electric power. The EX-OR gate is larger in the number of constituent elements than the OR gate and the NAND gate. For that reason, according to the configurations illustrated in FIGS. 9 and 10, the EX-OR is replaced with the OR gate 91 or the NAND gate 101, as a result of which an area overhead can be reduced as compared with a case using the EX-OR. In the semiconductor device designed in the designing apparatus 1 illustrated in FIG. 1, the scan chain is structured every plural scan flip-flop circuits having the same degree of probability of becoming a given logical state. Therefore, the probability that the value of each FF during the scan test operation becomes any one of the logical values 0 and 1 becomes high. For that reason, the configuration of FIG. 9 or 10 is applied according to the logical value to be continuously applied whereby a reduction in the area overhead and a reduction in the electric power can be achieved.

Fourth Embodiment

Subsequently, the hold timing countermeasure of the power reduction scan FF will be described.

In the power reduction scan FF, the hold timing countermeasure cannot be ignored. In both of the shift operation and the capture operation, a change is allowed only during the low level period of the clock clk, and if an input value of the internal FF is changed during the high level period of the clock clk, the output value is unfixed.

Figure 11:
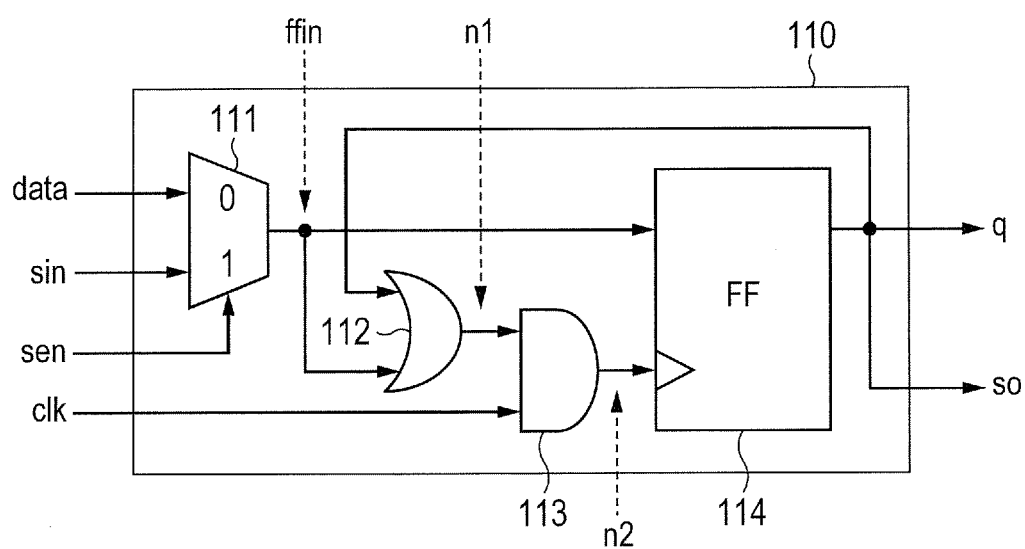
FIG. 11 is a circuit diagram illustrating a configuration example of a scan FF without a hold infringement countermeasure.
Figure 12:
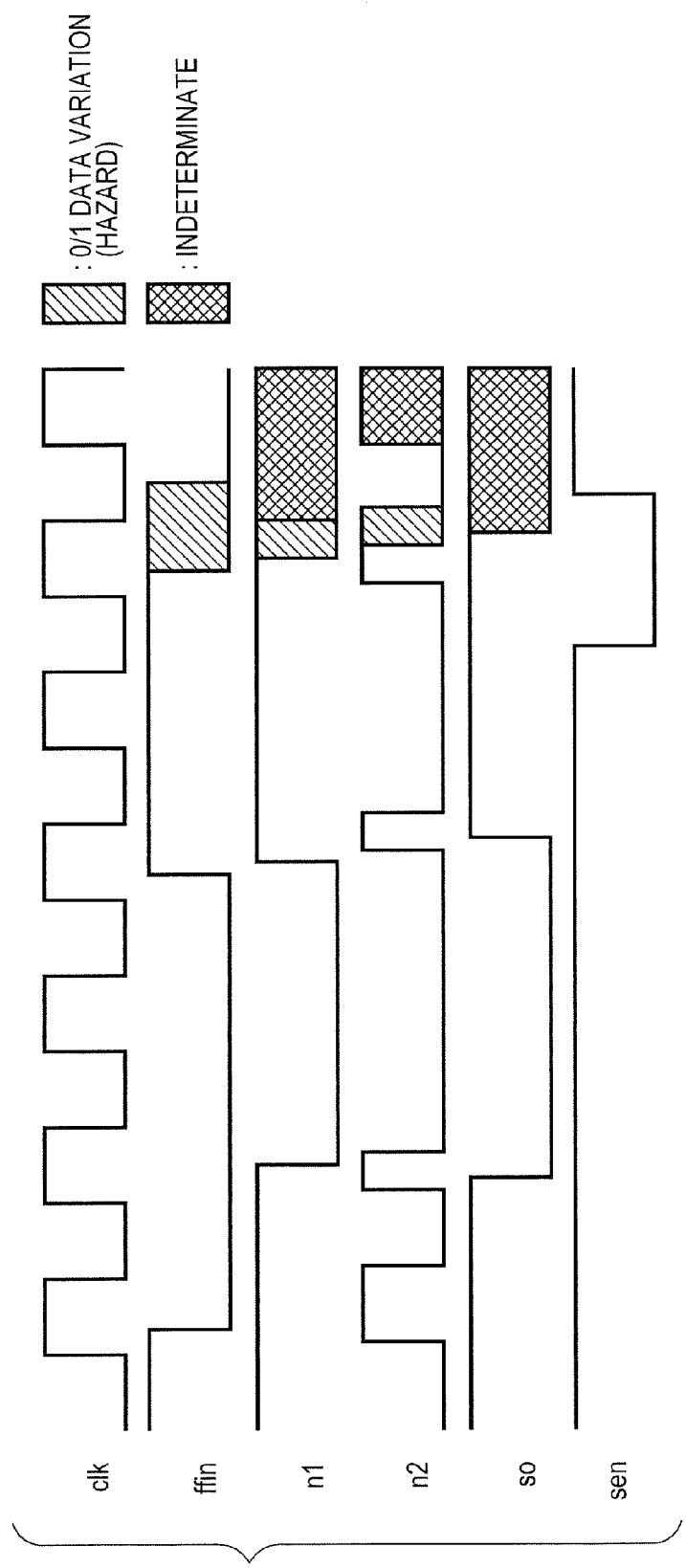
FIG. 12 is a timing diagram illustrating the operation of the main portion in the scan FF illustrated in FIG. 11.

FIG. 11 illustrates the scan FF without the hold infringement countermeasure. A scan FF 110 includes a multiplexer 111, an OR gate 112, an AND gate 113, and an internal FF 114, and can reduce the electric power only when the logical value of 0 is continuously applied. The switching between the scanning operation and the capturing operation is conducted according to a scan enable signal sen to be input to the multiplexer 111. When the logical value of a node ffin is 0, and the logical value of a scan-out terminal so is 0, a clock input (node n2) to the internal FF 114 is masked, and not output. If an input value (value of node ffin) to the internal FF 114 is changed during the low level period of the clock clk, the internal FF 114 normally operates without generating an incorrect output. When the value of the node ffin is changed during a period where the current value is 0, and the clock clk is high level, a clock pulse is generated in the node n2 under the influence thereof. That is, the clock is output, and becomes the incorrect value during the period where masking is to be conducted. Also, in the capturing operation, if a value is varied in the data terminal during the high level period of the clock clk, a high-speed clock is output, resulting in a risk that the logical value of the output q becomes unfixed. FIG. 12 illustrates an example of this case. That is, in the power scan FF 110, the value is varied in the data input terminal during the high level period of the clock clk to output an incorrect value.

Figure 13:
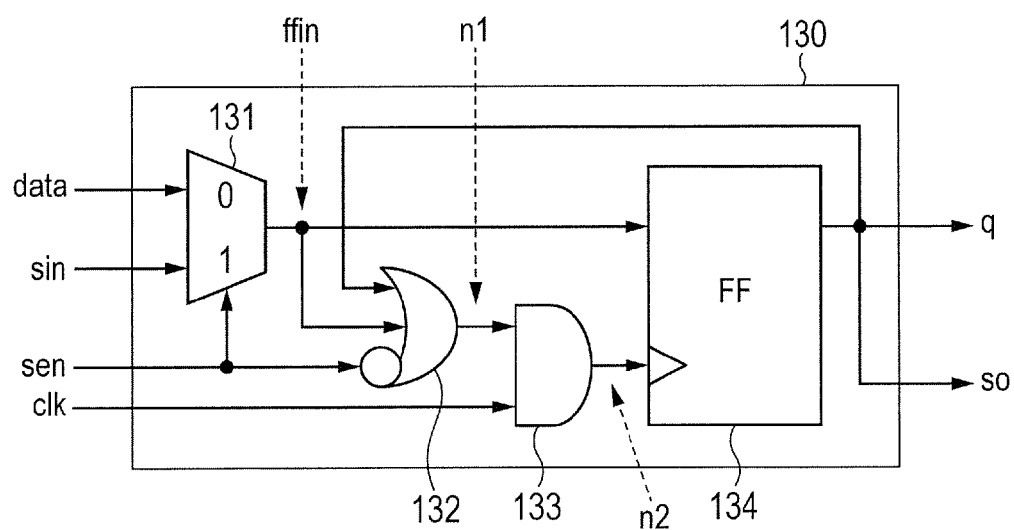
FIG. 13 is a circuit diagram illustrating a configuration example of a power reduction scan FF that conducts the hold infringement countermeasure during capturing operation.
Figure 14:
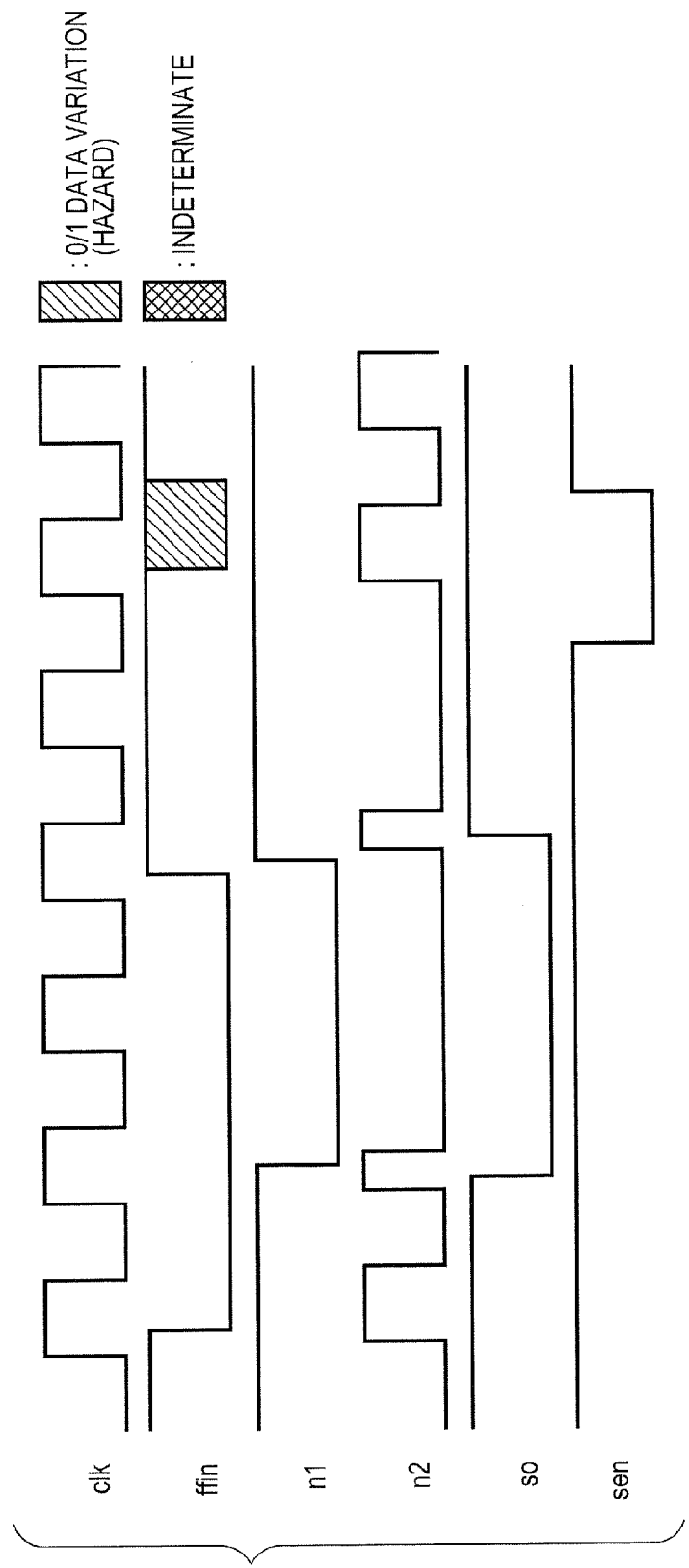
FIG. 14 is a timing diagram illustrating the operation of the main portion in the power reduction scan FF illustrated in FIG. 13.

FIG. 13 illustrates an example of the power reduction scan FF that conducts the hold infringement countermeasure in the capturing operation. A power reduction scan FF 130 illustrated in FIG. 13 includes a multiplexer 131, an OR gate 132, an AND gate 133, and an internal FF 134. The power reduction scan FF illustrated in FIG. 13 is largely different from that illustrated in FIG. 11 in that the OR gate 132 is provided. A scan enable signal SEN is logically inverted, and then input to the OR gate 132. As a result, the clock masking function is enabled only during the scan enable signal SEN is high level (in the scan shift operation), and the clock mask is disabled in the capturing operation. As a result, in the capturing operation, even if a value is varied in the data input terminal during the high level period of the clock clk, the output value does not become uncertain, resulting in no risk that the hold timing infringement occurs. However, during the shift operation period, there is a risk that the hold timing infringement occurs. For example, as illustrated in FIG. 14, if a value is varied in the data terminal during the high level period of the clock clk, the value becomes incorrect.

Figure 15:
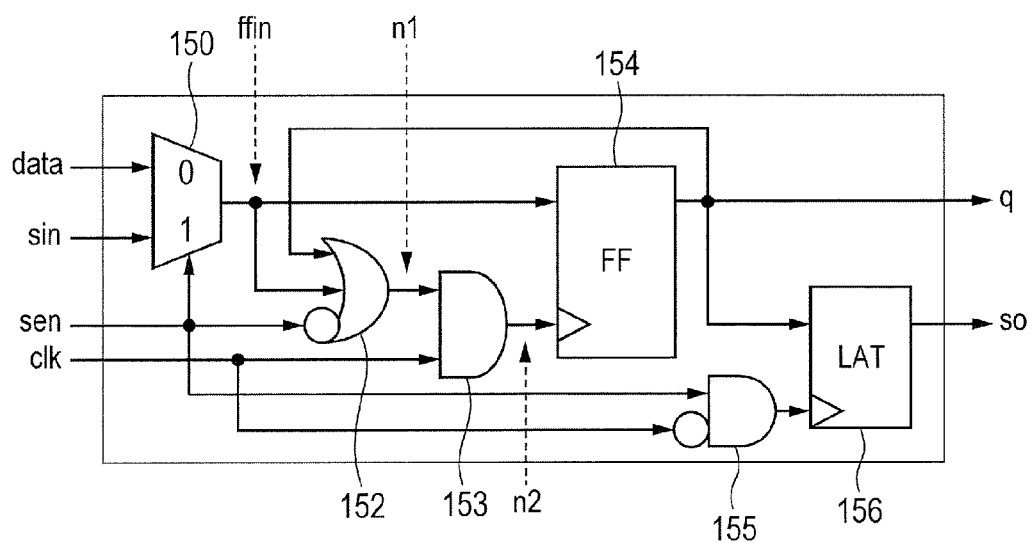
FIG. 15 is a circuit diagram illustrating a configuration example of the scan FF that can reduce the power only when the value of the logical value 0, where the hold infringement countermeasure is conducted during the shift operation and the capturing operation, is continuously applied.

FIG. 15 illustrates an example of the scan FF that can reduce the electric power only when the logical value of 0 is continuously applied, which is subjected to the hold infringement countermeasure in the shift operation and the capturing operation. The scan FF illustrated in FIG. 15 includes a multiplexer 151, an OR gate 152, an AND gate 153, an internal FF 154, an AND gate 155, and a latch circuit 156. The power reduction scan FF illustrated in FIG. 15 is largely different from that illustrated in FIG. 13 in that the AND gate 155 and the latch circuit 156 are provided. Thus, the latch circuit 156 that receives an inverted clock is disposed immediately before the scan-out terminal so. As a result, a value of the scan-out terminal so is updated only during the low level period of the clock, and therefore the value of the data input terminal is not varied during the high level period of the clock clk in the shift operation, resulting in no concern about the hold timing infringement. Also, the AND gate 155 is coupled to a clock input terminal of the latch circuit 156 for hold countermeasure, and masking is conducted with a scan enable signal sen in the normal operation. As a result, since the operation of the latch circuit 156 is limited in the normal operation, the power consumption is reduced.

Figure 16:
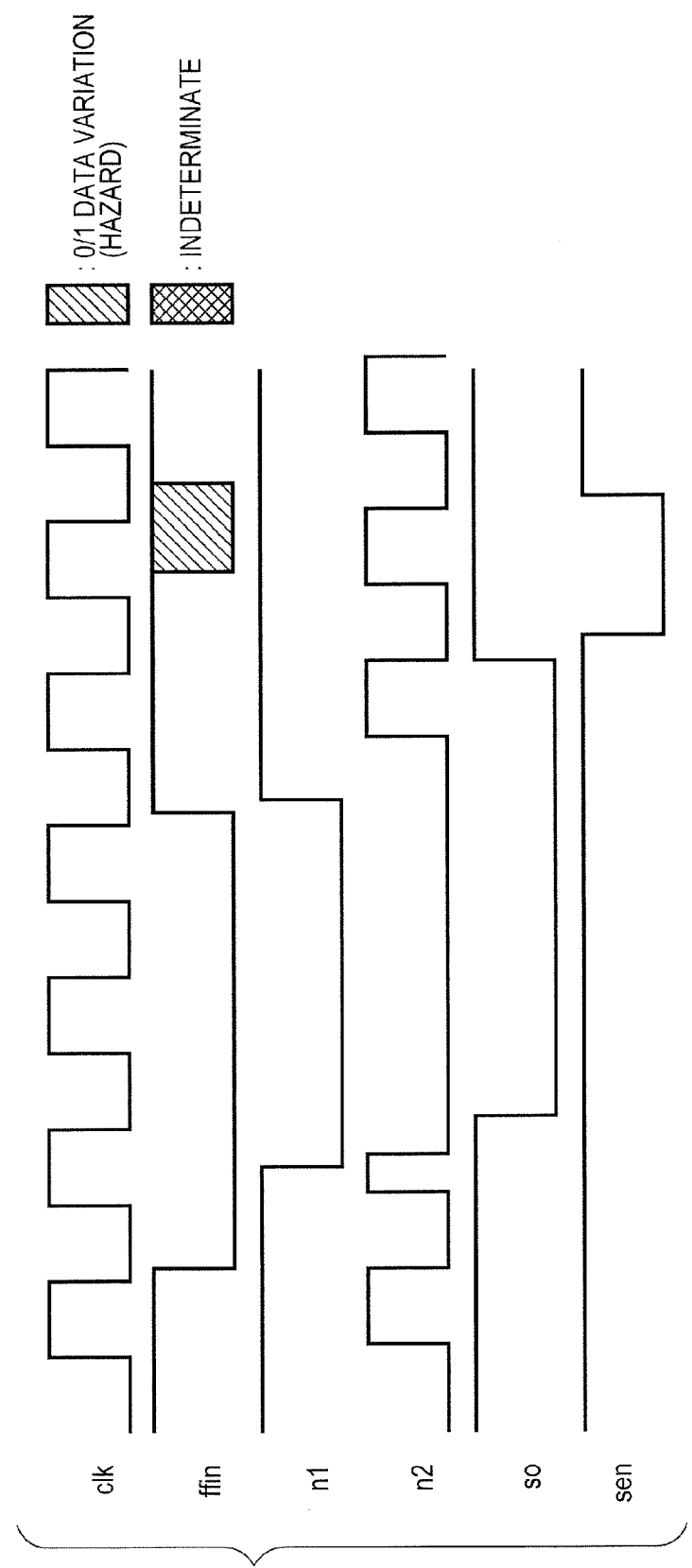
FIG. 16 is a timing diagram illustrating the operation of the main portion in the scan FF illustrated in FIG. 15.

The inverted clock is applied to the latch circuit 156. In this case, because the value of the scan-out terminal so is updated only when the value of clock is low level, the value of node ffin in the scan shift operation is changed only during the low level period of the clock. For that reason, as illustrated in FIG. 16, no incorrect clock caused by the hold timing infringement during the high level period of the clock clk in the scan shift operation is output. Therefore, even if the data of the data terminal is varied during the high level period of the clock clk in the capturing operation, the output value is not unfixed.

Fifth Embodiment

Figure 17:
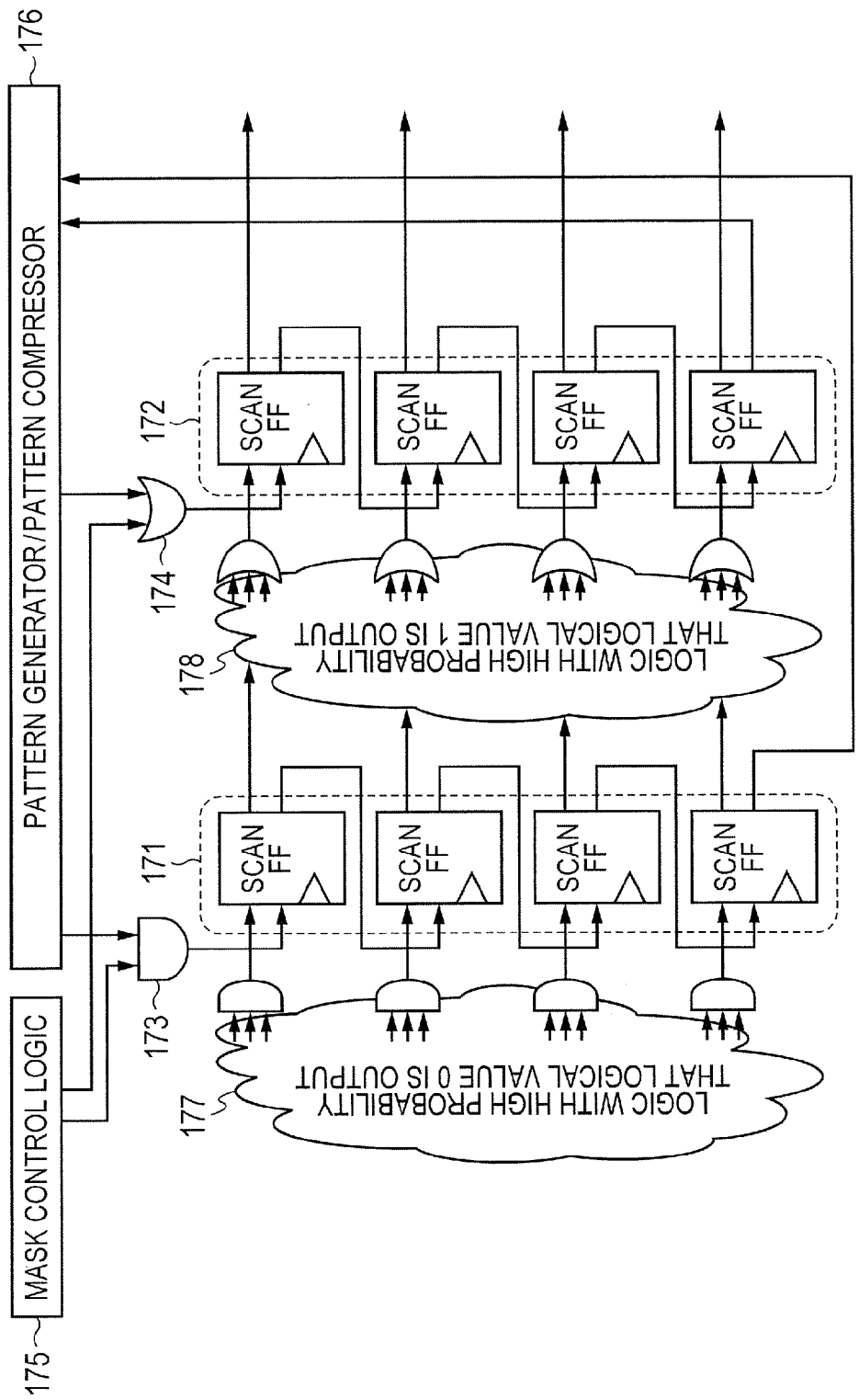
FIG. 17 is a circuit diagram illustrating one configuration example of the semiconductor device according to the present invention.

FIG. 17 illustrates a configuration example of a semiconductor device according to the present invention.

A semiconductor device 170 illustrated in FIG. 17 is designed by the designing apparatus 1 illustrated in FIG. 1. The semiconductor device 170 has the scan chains each configured by an assembly of the FFs having the same degree of probability that the logical value after capturing operation is 1. At least one of those scan chains has a function of conducting fixed value masking on the logical value 0 or 1 corresponding to a value higher in the probability provided to the FFs configuring the scan chains after the capturing operation.

The semiconductor device 170 illustrated in FIG. 17 includes scan chains 171, 172, an AND gate 173, an OR gate 174, a mask control logic 175, a pattern generator/pattern compressor 176, a logic 177 that is higher in the probability that the logical value of 0 is output, and a logic 178 that is higher in the probability that the logical value of 1 is output.

The scan chain 171 is configured by an assembly of the scan FFs higher in the probability that the logical value becomes 0 after the capturing operation. An output of the AND gate 173 is transmitted to a scan-in terminal of a first scan FF in the scan chain 171. An output of a scan-out terminal of the previous scan FF is transmitted is transmitted to each scan-in terminal of second and subsequent scan FFs in the scan chain 171. The scan chain 172 is configured by an assembly of the scan FFs high in the probability that the logical value becomes 1 after the capturing operation. An output of the OR gate 174 is transmitted to a scan-in terminal of a first scan FF in the scan chain 172. An output of a scan-out terminal of the previous scan FF is transmitted to each scan-in terminal of second and subsequent scan FFs in the scan chain 172. An output of the logic 177 higher in the probability that the logical value of 0 is output is transmitted to a data terminal of each scan FF in the scan chain 171. An output of each scan FF in the scan chain 172 is transmitted to the logic 178 higher in the probability that the logical value of 1 is output. Then, an output of the logic 178 higher in the probability that the logical value of 1 is output is transmitted to a data terminal of each scan FF in the scan chain 172. Scan outputs of the last scan FFs in the scan chains 171 and 172 are transmitted to the pattern generator/pattern compressor 176.

The AND gate 173 ANDs an output of the mask control logic 175 and an output of the pattern generator/pattern compressor 176. The OR gate 174 ORs an output of the mask control logic 175 and an output of the pattern generator/pattern compressor 176. The mask control logic 175 can mask the scan chain 171 with the logical value of 0 with the intervention of the AND gate 173. Also, the mask control logic 175 can mask the scan chain 172 with the logical value of 1 with the intervention of the OR gate 174.

With the above configuration, in the capturing operation, the output of the logic 177 higher in the probability that the logical value of 0 is output is taken in the scan chain 171, and the output of the logic 178 higher in the probability that the logical value of 1 is output is taken in the scan chain 172. In the scan shift operation, the test pattern data output from the pattern generator/pattern compressor 176 is transmitted to the scan chain 171 through the AND gate 173, and also transmitted to the scan chain 172 through the OR gate 174. Also, under the control of the mask control logic 175, instead of the output of the pattern generator, the logical value of 0 can be supplied to the scan chain 171, and the logical value of 1 can be supplied to the scan chain 172.

As a cause of increasing the power consumption during the scan test, the activation rate of the entire logic can be enhanced because of a high activation rate of the FFs during the scan shift operation. On the contrary, according to the above configuration, in the scan chain 171 configured by the FFs having the same degree of probability that the logical value is 1, the activation rate caused by the shift-out (unload) after capturing operation is reduced. Also, the mask control logic 175 is configured to supply the logical value of 0 to the scan chain 171 high in the probability that the logical value is 0, and supply the logical value of 1 to the scan chain 172 high in the probability that the logical value is 1. Therefore, when the fixed value mask for the scan chain is enabled, the activation rate can be reduced due to a boundary between load and unload. Thus, the electric power of the semiconductor device including the scan flip-flop circuit can be reduced by reduction in the activation rate of the FFs.

Sixth Embodiment

Figure 18:
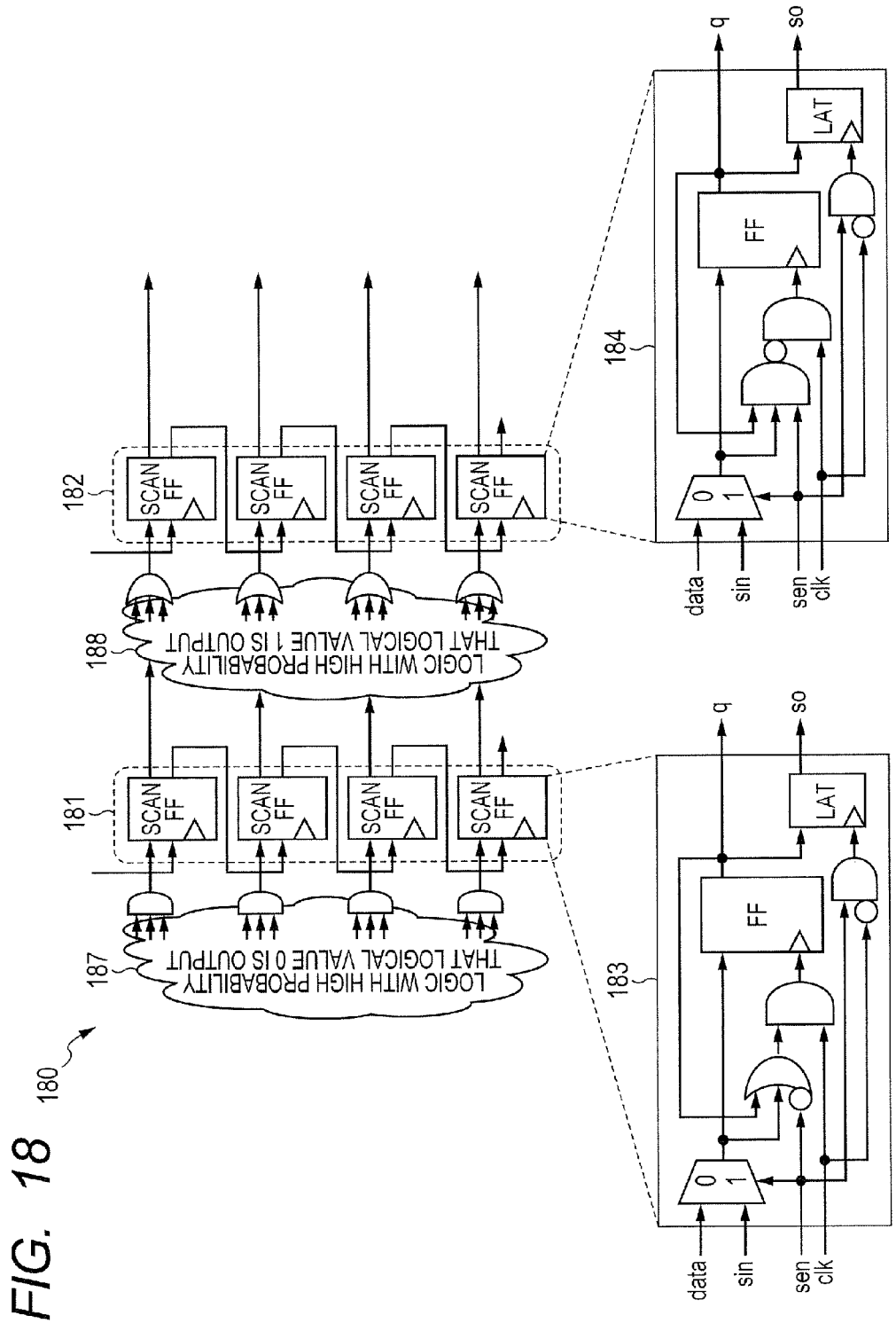
FIG. 18 is a circuit diagram illustrating another configuration example of the semiconductor device according to the present invention.

FIG. 18 illustrates another configuration example of the semiconductor device according to the present invention.

A semiconductor device 180 illustrated in FIG. 18 is designed by the designing apparatus 1 illustrated in FIG. 1. The semiconductor device 180 has the scan chains each configured by an assembly of the FFs having the same degree of probability that the logical value after capturing operation is 1. At least one of those scan chains can reduce the electric power only when the logical value 0 or 1 is continuously applied in correspondence with the higher probability provided to the FF after the capturing operation. At least one scan chain of this type exists.

A scan chain 181 is configured by an assembly of the FFs higher in the probability that the logical value is 0 after the capturing operation. A scan chain 182 is configured by an assembly of the FFs higher in the probability that the logical value is 1 after the capturing operation. An output of a logic 187 higher in the probability that the logical value of 0 is output is supplied to the scan chain 181. An output of a logic 188 higher in the probability that the logical value of 1 is output is supplied to the scan chain 182. The scan FF that can reduce the electric power only when the logical value of 0 is continuously applied is applied to a scan FF 183 configuring the scan chain 181. The scan FF 183 has the same configuration as that illustrated in FIG. 15. The scan FF that can reduce the electric power only when the logical value of 1 is continuously applied is applied to a scan FF 184 configuring the scan chain 182. The scan FF 184 corresponds to the FF illustrated in FIG. 10 added with the multiplexer 151, the AND gate 155, and the latch circuit 156 illustrated in FIG. 15.

Although omitted from FIG. 18, components corresponding to the AND gate 173, the OR gate 174, the mask control logic 175, and the pattern generator/pattern compressor 176 in FIG. 17 are provided.

The FFs included in the scan chain configured by the FFs higher in the probability that the logical value is 0 after the capturing operation has a high possibility that the logical value of 0 is continuously applied in shift-out (unload) after the capturing operation. For that reason, in the scan FF 183 that can reduce the electric power only when the activation rate caused by unload is reduced, and the logical value of 0 is continuously applied, the possibility that the power reduction function is effected is increased. Also, the FFs included in the scan chain configured by the FFs higher in the probability that the logical value is 1 after the capturing operation has a high possibility that the logical value of 1 is continuously applied in shift-out (unload) after the capturing operation. For that reason, in the scan FF 184 that can reduce the electric power only when the activation rate caused by unload is reduced, and the logical value of 1 is continuously applied, the possibility that the power reduction function is effected is increased.

Seventh Embodiment

Figure 19:
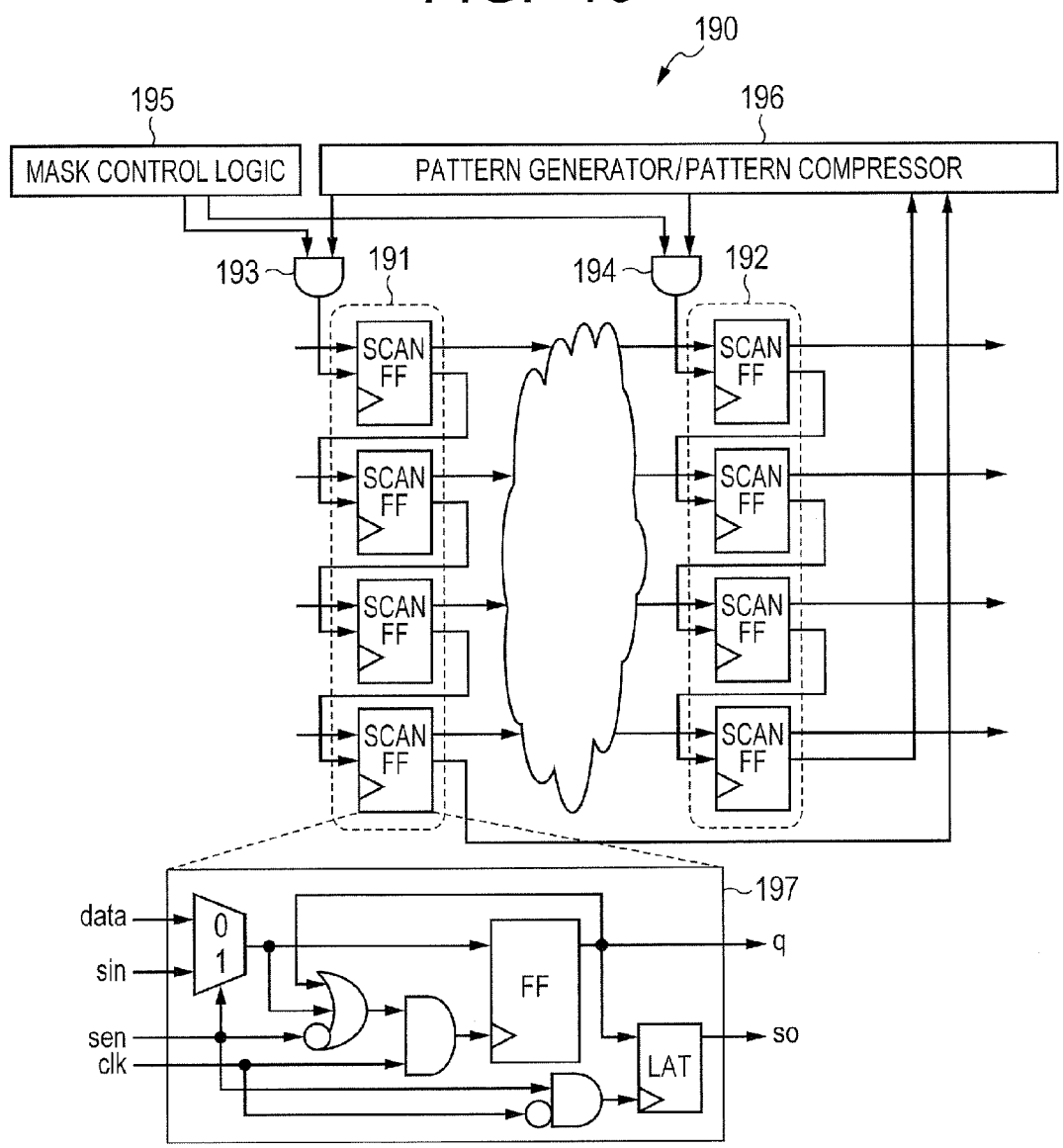
FIG. 19 is a circuit diagram illustrating still another configuration example of the semiconductor device according to the present invention.

FIG. 19 illustrates another configuration example of the semiconductor device according to the present invention.

A semiconductor device 190 illustrated in FIG. 19 includes scan chains 191, 192, AND gates 193, 194, a mask control logic 195, and a pattern generator/pattern compressor 196. Each of the scan chains 191 and 192 are each configured by an assembly of the FFs higher in the probability that the logical value is 0 or 1. The scan chains 191 and 192 can be mask-controlled by the fixed value mask. The scan chains 191 and 192 each include a scan FF 197 that can reduce the electric power only when any one of the logical values of 0 and 1 corresponding to a value of the mask by the fixed value mask is continuously applied. The same configuration as that of the scan FF 183 illustrated in FIG. 18 can be applied to the scan FF 197. In this case, in the scan FF that can reduce the electric power, when the logical value of 0 is continuously applied, since the possibility of the power reduction is high, the power reduction can be expected. The same configuration as that of the scan FF 184 illustrated in FIG. 18 can be applied to the scan FF 197. In this case, in the scan FF that can reduce the electric power, when the logical value of 1 is continuously applied, the power reduction possibility is enhanced.

Eighth Embodiment

In the designing apparatus 1 illustrated in FIG. 1, the substitution of the power reduction scan FF is conducted taking an area limitation of the semiconductor device into account. In the power reduction scan FF, because the area of the cell is large, if all of the FFs are substituted with the power reduction scan FFs, the area overhead is increased. For that reason, with the area limitation, the scan FFs higher in the power reduction effect are preferentially substituted with the power reduction scan FF cells, thereby obtaining the higher power reduction effect with suppression of the area overhead. When the area exceeds the area limitation, the use of the power reduction scan FFs stops, and the normal scan FFs may be used.

Figure 20:
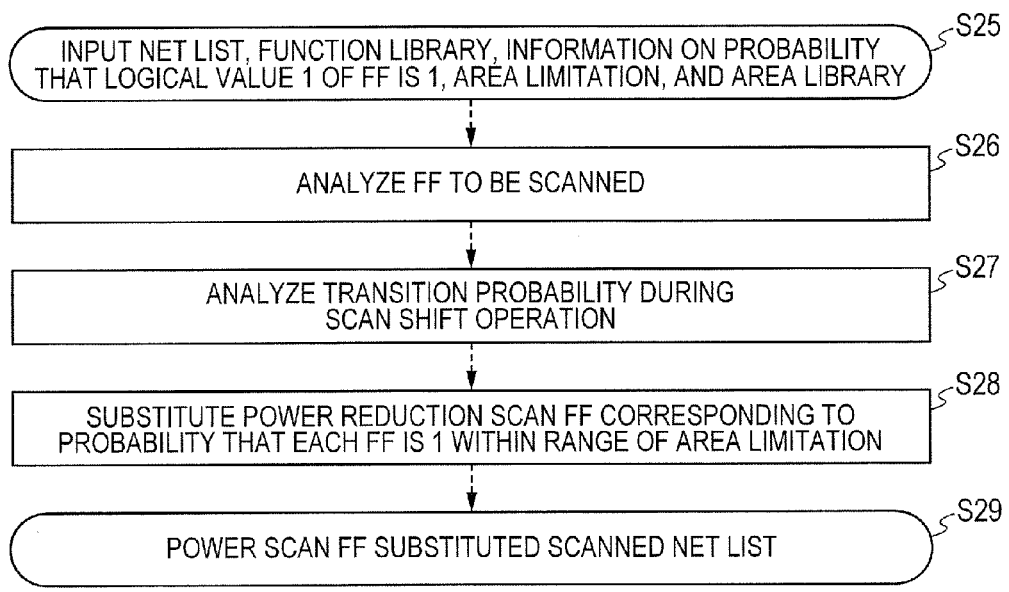
FIG. 20 is a flowchart illustrating another main processing in the designing apparatus illustrated in FIG. 1.

The input net list assumed in this function is regardless of the presence or absence of the scan chain, and the presence or absence of the addition of the fixed value masking function. However, before the scan chain is structured, the power reduction scan FF substitution assuming a final net list (presence or absence of the fixed value mask, and the presence or absence of the scan chain using the information on the probability of each FF that the logical value is 1) is conducted. The power reduction scan FF substituted net list using this function can be created in a procedure illustrated in FIG. 20 with input of the net list, the function library, the information on the probability of the FF that the logical value is 1, the area library, and the area limitation.

The area limitation and the area library are taken in the arithmetic processor 3 in addition to the net list 41, the functional library 42, and the probability list 43 of the FF that the logical value is 1 (S25).

The FF to be scanned is identified from the input net list 41 (S26). When the power reduction scan FF substituted net list is referred to, the FFs identified by a chain trace is targeted. A transition probability of the identified FF to be scanned in the shift operation is analyzed (S27). The analysis procedure of the transition probability is conducted according to the type of input net list as will be described in detail later. Then, the scan FFs are substituted with the power reduction scan FFs that can reduce the electric power only when any one of the logical value 0 and 1 is continuously applied in correspondence with the value higher in the probability provided to the FF in the ascending order of the transition probability within the range of the area limitation (S28). Then, the power reduction scan FF substituted net list 46 is created (S29).

Subsequently, a description will be given of calculation of the transition probability of the FF in the scan shift operation in the above Step S27.

A method of calculating the transition probability of the FF in the input net list is classified into the following three sections.

That is, (1) a case of the fixed value mask added net list (including no scan chain structured by using the probability that the FF has the logical value of 1), (2) a case of the net list of a chain configuration based on the probability that the FF has the logical value of 1 (having no fixed value masking function), and (3) of the net list having the chain configuration based on the probability that the FF has the logical value of 1, and having a function of the fixed value mask.

(1) First, a description will be given of a case of the fixed value mask added net list (having no scan chain structured by using the probability that the FF has the logical value of 1).

It is assumed that the activation rate of the load, which is controlled by the fixed value mask during the pattern generation, is N % (N=0 to 50), the maximum number of the chains in the circuit is "L", the activation rate of the unload of the scan FF is "½", and the number of FFs from a head of the chain to which that scan FF belongs to that FF is "B". In this case, the probability that the FF is not transited is represented by the following expression. Symbol "*" represents multiplication.

$$(\tfrac{1}{2})*(B/L)+[(100-N)/100]*[1-(B/L)] \qquad \text{Ex. 1}$$

In the power reduction scan FF substitution based on the area limitation, the FFs are simply substituted in order of getting away a start end of the scan chain. This is because continuous values are liable to be applied to the FF close to the start end of the scan chain under the influence of the fixed value mask.

(2) Subsequently, a description will be given of a case of the net list of the chain structure based on the probability that the FF has the logical value of 1 (having no fixed value masking function).

It is assumed that the maximum number of chains in the circuit is "L", the probability of the scan FF that the logical value is 1 is "A", and the number of FFs from a head of the chain to which that scan FF belongs to that FF is "B". In the case of the chain configured by the assembly of the FF having the same degree of probability that the logical value is 1, there is the high possibility that the probability of the FFs configuring the chain that the logical value is 1 is close to 0 or 1, and the continuous values are more applied to the FFs closer to the scan chain terminal. In the FF at the terminal of the chain, the probability that the FF is not transited at the time of unload is represented by "1−A" if A≤½, and "A" if A>½. Accordingly, the probability that the FF is not transited is represented by the following expression.

If A≤½, $$(1-A)*(B/L)+(\tfrac{1}{2})*[1-(B/L)] \qquad \text{Ex. 2}$$

If A>½, $$A*(B/L)+(\tfrac{1}{2})*[1-(B/L)] \qquad \text{Ex. 3}$$

In the power reduction scan FF substitution based on the area limitation, the FFs are substituted with the power reduction scan FFs in descending order of the calculation value.

(3) Subsequently, a description will be given of a case of the net list of the chain configuration based on the probability that the FF has the logical value of 1, which has a function of the fixed value mask.

It is assumed that the activation rate of the load, which is controlled by the fixed value mask during the pattern generation, is N % (N=0 to 50), the maximum number of the chains in the circuit is "L", the probability of the scan FF that the logical value is 1 is "A", and the number of FFs from a head of the chain to which that scan FF belongs to that FF is "B". If the activation rate of the load is N %, the probability that the FF which is a head of a certain chain is not transited is 1−(N/100). This probability is influenced more as the FF is closer to the head of the chain. Also, the probability is more influenced by unload as the FF is closer to the terminal. Accordingly, the probability that the FF is not transited is represented by the following expression.

If A≤½, $$(1-A)*(B/L)+(100-N)/100*[1-(B/L)] \quad (4)$$

If A>½, $$A*(B/L)+(100-N)/100*[1-(B/L)] \quad (5)$$

In the power reduction scan FF substitution based on the area limitation, the FFs are substituted with the power reduction scan FFs in descending order of the calculation value.

The possibility that the same value is applied to the FFs is higher as the transition probability of the FFs during the scan shift operation is lower, and the power reduction effect by the clock mask is larger when the FFs are substituted with the power reduction scan FFs. The information on the calculated transition probability of the FFs is used in determination of the priority of substitution when the FFs are substituted with the power reduction scan FFs. Only the FFs higher in the priority are substituted to the power reduction scan FFs so that the high power reduction effect is obtained although the area overhead is low.

Ninth Embodiment

In a designing method according to this embodiment, in the power reduction scan FF substitution, the FFs are substituted with the power reduction scan FFs so as to satisfy the power reduction limitation. In the power reduction scan FFs, because the area of the cell is large, if all of the FFs are substituted with the power reduction scan FFs, the area overhead becomes larger. For that reason, with a power limitation, the scan FFs higher in the power reduction effect are preferentially substituted with the power reduction scan FF cells, thereby obtaining the higher power reduction effect with suppression of the area overhead. When the power limitation is satisfied, the use of the power reduction scan FFs stops, and the normal scan FFs are used.

The input net list assumed in this designing method is regardless of the presence or absence of the scan chain, and the presence or absence of the addition of the fixed value masking function. However, before the scan chain is structured, the power reduction scan FF substitution assuming a final net list (presence or absence of the fixed value mask, and the presence or absence of the scan chain using the information on the probability of each FF that the logical value is 1) is conducted. In the case of the scanned net list, the FF identified by the chain trace is targeted. The power reduction scan FF substituted net list using this function can be created in the following procedure with input of the net list, the information on the probability that the FFs have the logical value of 1, the power library, and the power limitation. First, the FFs to be scanned are identified from the input net list. A transition probability of the identified FF to be scanned in the shift operation is analyzed. The analysis procedure of the transition probability is conducted according to the type of input net list in the procedure of the seventh embodiment. The power consumption is obtained according to the transition probability of the FFs during the scan shift operation, which is obtained from the analysis result, and the power library. The power consumptions to be obtained are the current power consumption of the FFs, and the power consumption when the FFs are substituted with the scan FFs that can reduce the electric power only when any one of the logical values 0 and 1 corresponding to the higher value of the FF is continuously applied. The FFs are substituted with the power reduction scan FFs in order of decreasing a difference between the current power consumption and the power consumption during the power reduction scan FF substitution. Then, when the power limitation is satisfied, the substitution of the power reduction scan FFs stops. Finally, the power reduction scan FFs substituted net list is output.

Figure 21:
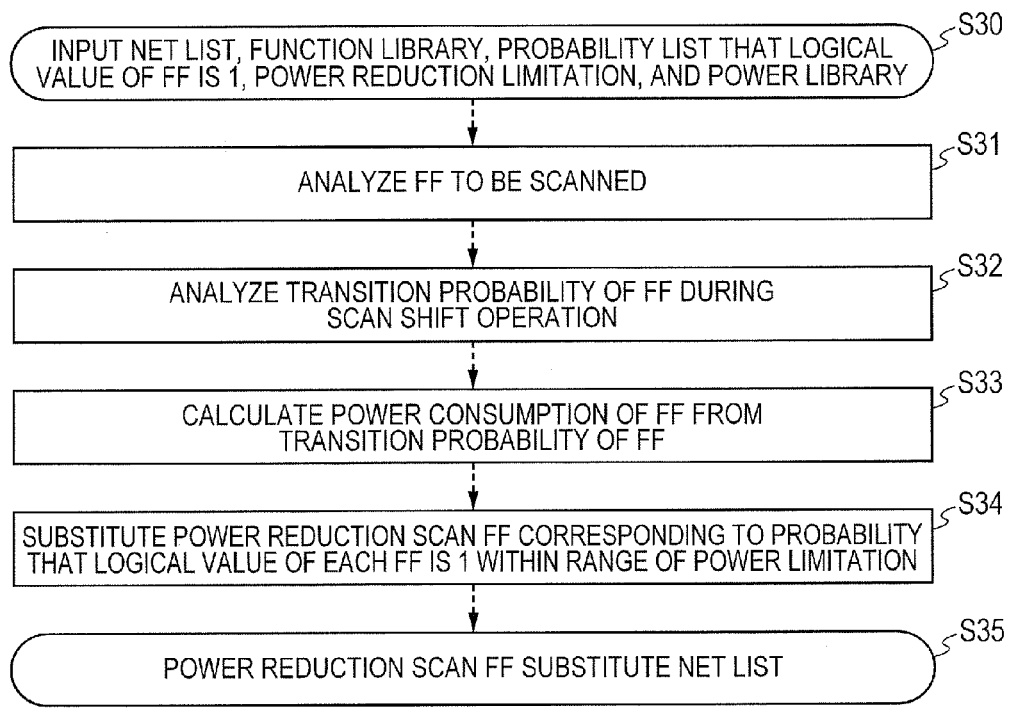
FIG. 21 is a flowchart illustrating still another main processing in the designing apparatus illustrated in FIG. 1.

As an execution flowchart example of this function, an expansion example of the second embodiment is illustrated in FIG. 21. A transition probability analysis step (S32) during the scan shift operation and a power consumption calculation step (S33) are added after the power consumption calculation step (S31) in the second embodiment. In the case of expansion from the third embodiment, likewise, a transition probability analysis step and a power consumption calculation step are added after the scan chain analysis step of the third embodiment.

When the power consumption of each FF is roughly estimated, the FFs high in the effect of the power reduction scan FFs can be selected. Also, in order to roughly estimate the power consumption, the FFs to be substituted can be selected on the basis of the power limitation. When only the FFs high in the power reduction effect are substituted with the power reduction scan FFs, the high power reduction effect is obtained regardless of the low area overhead.

Tenth Embodiment

IN a designing method according to this embodiment, a test point for bringing the probability that the FF has the logic value of 1 closer to 0 or 1 is inserted. That is, on the basis of the result of the information on the probability of each FF that the logical value is 1, the test point is inserted into the FFs having the probability close to ½ so as to bring the probability closer to 0 or 1. The general technique can be applied for the test point insertion. For example, an AND gate or an OR gate is inserted, and a test point control FF is inserted. The probability that the logical value is 1 is again derived from the net list obtained as a result of the test point insertion, and the probability information of the probability of each FF that the logical value is 1 is output.

Figure 22:
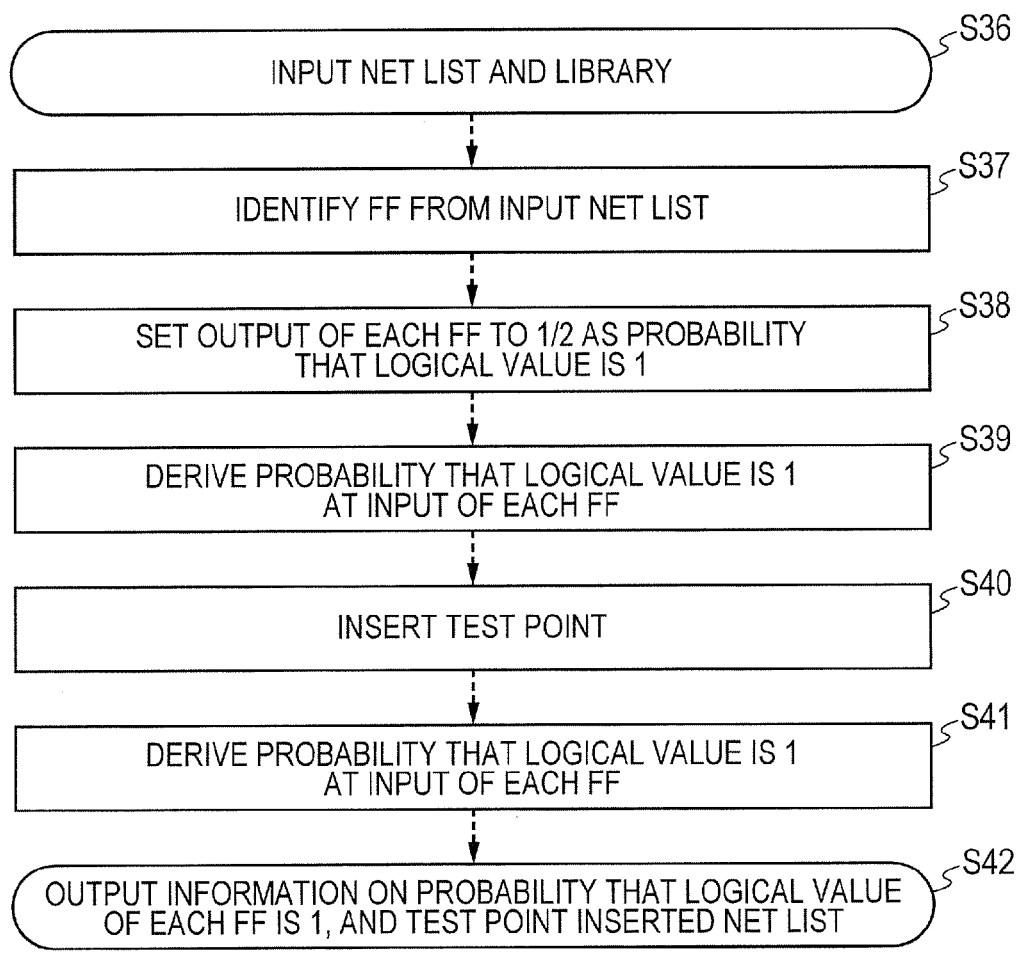
FIG. 22 is a flowchart illustrating yet still another main processing in the designing apparatus illustrated in FIG. 1.

FIG. 22 illustrates an execution flowchart when expanding a function of making the logical value 1 in each FF according to the first embodiment.

In this example, a test point insertion step and a step of recalculating the probability after insertion of the test point are added after the analysis step of the probability that the logical value is 1 according to the first embodiment. In this flowchart, a logical structure is analyzed according to the input net list and the library in Step S36, and the FFs to be scanned is identified (S37). Then, the probability that the logical value of the output value of the identified FF is 1 is set to ½, and the probability that the logical value of an external input terminal is also 1 is set to ½ (S38). Then, the probability that the logical value is 1 at the end point of the path after passing through the logical is derived from the designation of ½ in the previous step (S39). Then, the test point is inserted into the FF having the probability close to ½ according to the identified result (S40), to thereby bring the probability that the FF has the logical value of 1 closer to 0 or 1. The probability that the FF influenced by the test point insertion has the logical value of 1 is recalculated (S41). Finally, the analysis results of the probability and a TPI net list is output (S42).

When the chain configuration based on the probability that the FF has the logical value of 1, and the substitution of the power reduction scan FFs are assumed, the power reduction effect is reduced in the FF in which the probability that the logical value becomes 1 after the capturing operation is close to ½. Under the circumstances, the probability that the FF has the logical value of 1 after the capturing operation is brought closer to 0 or 1. As a result, the transition rate during the test operation is reduced, to thereby obtain the higher power reduction effect.

Eleventh Embodiment

Figure 23:
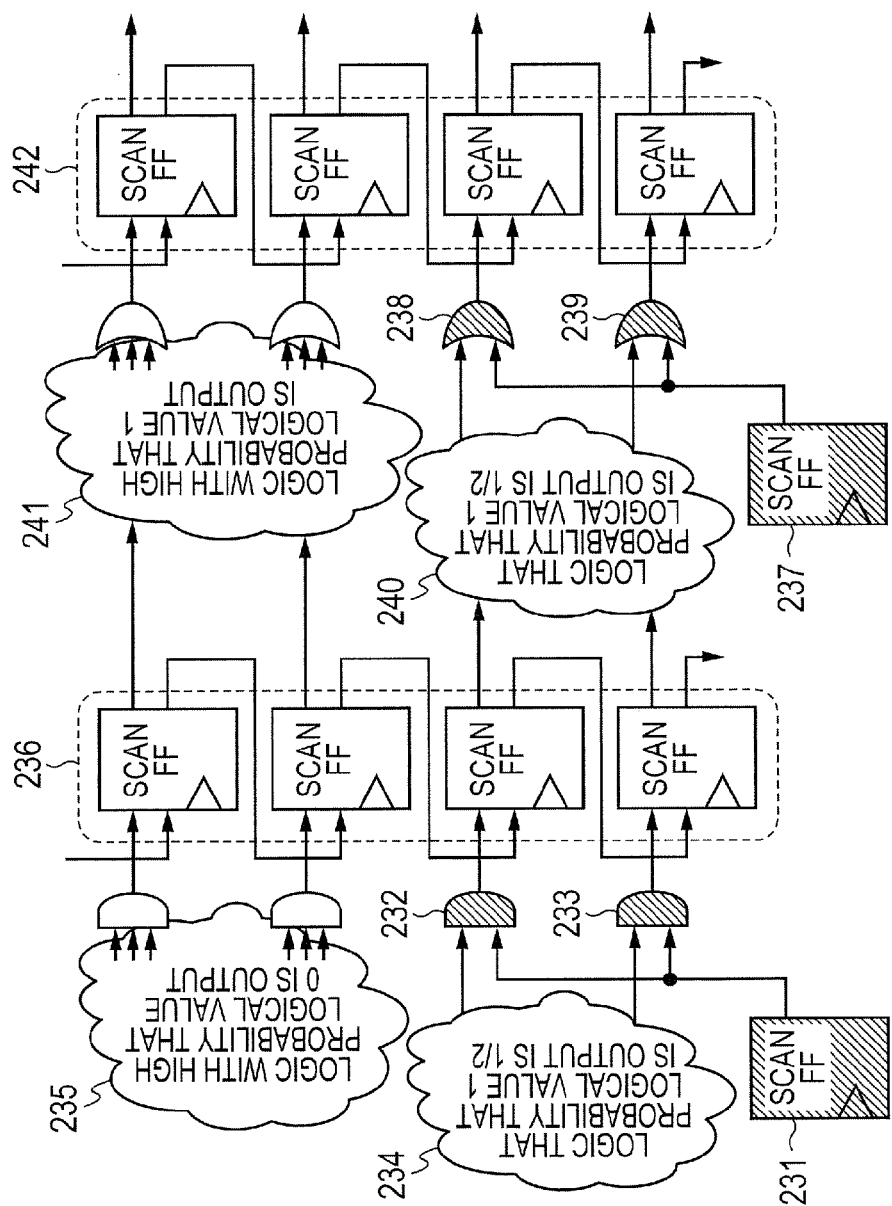
FIG. 23 is a circuit diagram illustrating another configuration example of the semiconductor device according to the present invention.
Figure 24:
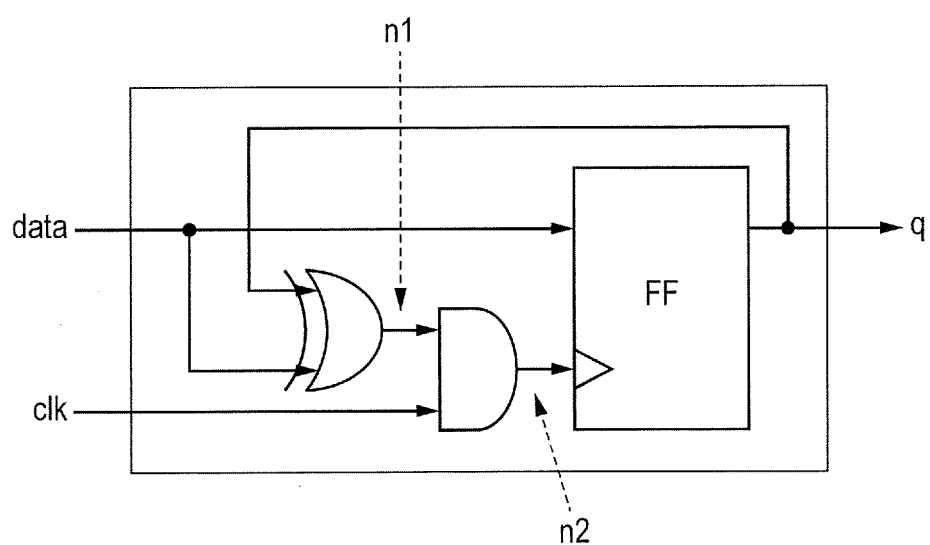
FIG. 24 is a circuit diagram illustrating a configuration example of the FF in which the output logic is unfixed under the influence of hazard.
Figure 25:
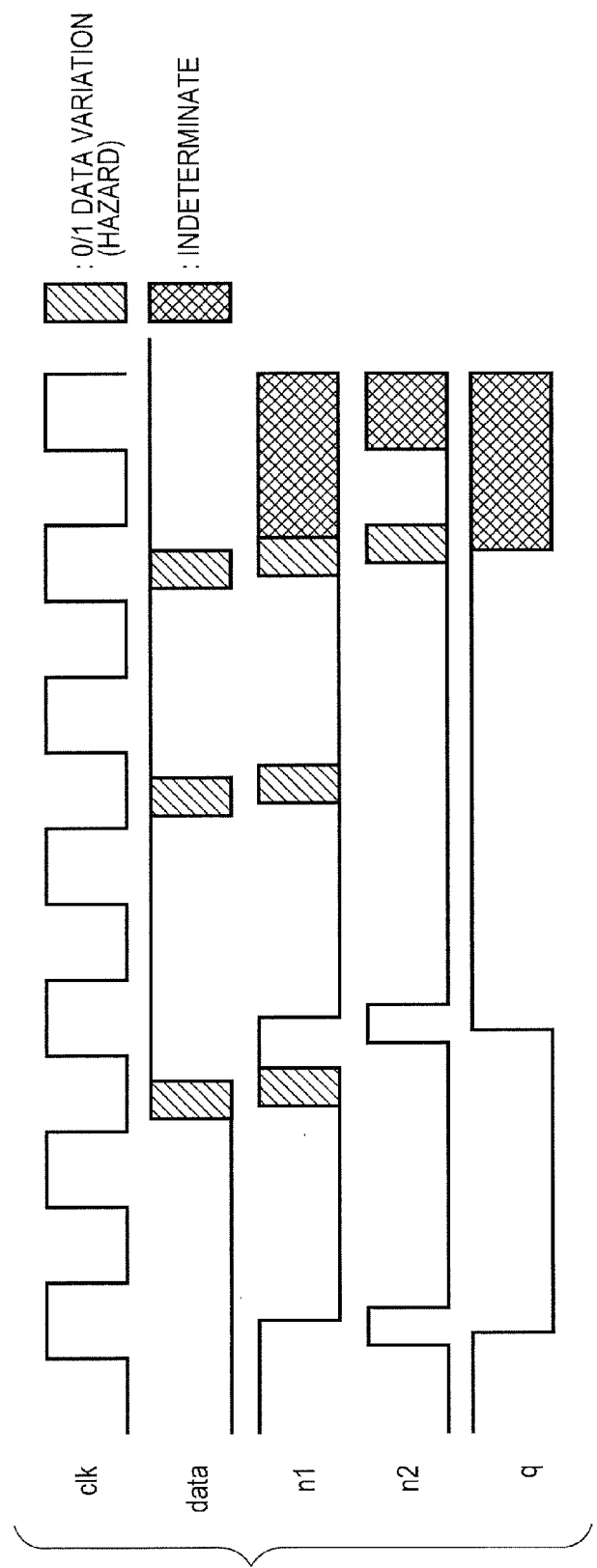
FIG. 25 is a timing chart illustrating the operation of the main portion in the FF illustrated in FIG. 24.

FIG. 23 illustrates a configuration example of a semiconductor device having the test point inserted according to the designing method of the tenth embodiment.

A semiconductor device 230 illustrated in FIG. 23 includes a logical 235 high in the probability that the logical value of 0 is output, a logical 234 ½ in the probability that the logical value of 1 is output, a scan chain 236, a logical 241 high in the probability that the logical value of 1 is output, a logical 240 ½ in the probability that the logical value of 1 is output, and a scan chain 242. The semiconductor device 230 has two test points for bringing the probability that the FF has the logical value of 1 after the capturing operation closer to 1 or 0. A circuit (called "first test point circuit") configuring a first test point includes AND gates 232, 233, and a scan FF 231. A circuit (called "second test point circuit") configuring a second test point includes OR gates 238, 239, and a scan FF 237. The AND gates 232 and 233 are arranged between the logical 234 ½ in the probability that the logical value of 1 is output, and the scan chain 236. The OR gates 238 and 239 are arranged between the logical 240 ½ in the probability that the logical value of 1 is output, and the scan chain 242.

In the above configuration, and the AND gates 232, 233 and the OR gates 238, 239 do not conduct masking at the test points in the normal operation. That is, the output of the scan FF 231 is set to the logical value of 1 whereby the output of the logical 234 ½ in the probability that the logical value of 1 is output is transmitted to the scan chain 242. After the capturing operation, the output of the scan FF 231 is set to the logical value of 0. As a result, the outputs of the AND gates 232 and 233 are masked with the logical value of 0. Therefore, although the scan FF having the output transmitted is arranged at the rear of the logical 234 ½ in the probability that the logical value of 1 is output, the FF is high in the probability that the logical value is 0 after the capturing operation. As a result, the scan chain 236 is configured by an assembly of the FFs high in the probability that the logical value is 0 after the capturing operation. Likewise, after the capturing operation, the output of the scan FF 237 is set to the logical value of 1. As a result, the outputs of the OR gates 238 and 239 are masked with the logical value of 1. Therefore, although the scan FF having the output transmitted is arranged at the rear of the logical 240 ½ in the probability that the logical value of 1 is output, the FF is high in the probability that the logical value is 1 after the capturing operation. As a result, the scan chain 242 is configured by an assembly of the FFs high in the probability that the logical value is 1 after the capturing operation. Thus, with a structure in which the activation rate in the shift operation can be reduced by the test point insertion, the power reduction effect is increased when any one of the logical values 0 and 1 is continuously applied.

The present invention made by the present inventors have been described above in detail with reference to the embodiments. However, the present invention is not limited to the above configurations, but can be variously changed without departing from the subject matter of the present invention.

What is claimed is:

1. A method of designing a semiconductor device including a scan flip-flop circuit that can switch between scanning operation and capturing operation, the method causing an arithmetic processor to execute the steps of:
   analyzing a probability that an output value of the scan flip-flop circuit after the capturing operation becomes a given logical state; and
   structuring a scan chain for a plurality of scan flip-flop circuits having the same degree of probability that the output value after the capturing operation becomes the given logical state, on the basis of a result of the analyzing step,
   wherein the method causes the arithmetic processor to execute a fixed value masking function addition step of adding a maskable mask control logic to a logical value higher in the probability provided to the scan flip-flop circuit included in each scan chain after the capturing operation, on the basis of information on the probability that each scan flip-flop circuit configuring the scan chain becomes the given logical state after the scan chain structuring step has been executed by the arithmetic processor.

2. The method of designing a semiconductor device according to claim 1, wherein the method causes the arithmetic processor to execute a substitution step of substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the compression scan addition step has been executed by the arithmetic processor.

3. The method of designing a semiconductor device according to claim 2, wherein the method causes the arithmetic processor to execute a step of inserting a test point circuit that can control the probability that the output value of the scan flip-flop circuit after the capturing operation becomes the given logical state.

4. The method of designing a semiconductor device according to claim 1, wherein the method causes the arithmetic processor to execute a substitution step of substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the scan chain structuring step has been executed by the arithmetic processor.

5. A designing apparatus that can design a semiconductor device including a scan flip-flop circuit that can switch between scanning operation and capturing operation, the apparatus comprising:
   an arithmetic processor that can execute given processing according to a predetermined program, wherein the arithmetic processor executes:

analysis processing for analyzing a probability that an output value of the scan flip-flop circuit after the capturing operation becomes a given logical state; and scan chain structure processing for structuring a scan chain for a plurality of scan flip-flop circuits having the same degree of probability that the output value after the capturing operation becomes the given logical state, on the basis of a result of the analysis processing.

6. The designing apparatus according to claim 5, wherein the arithmetic processor executes fixed value masking function addition processing of adding a maskable mask control logic to a logical value higher in the probability provided to the scan flip-flop circuit included in each scan chain after the capturing operation, on the basis of information on the probability that each scan flip-flop circuit configuring the scan chain becomes the given logical state after the scan chain structure processing has been executed.

7. The designing apparatus according to claim 6, wherein the arithmetic processor executes substitution processing of substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the compression scan addition processing has been executed.

8. The designing apparatus according to claim 5, wherein the arithmetic processor executes substitution processing of substituting the scan flip-flop circuit with a scan flip-flop circuit that can reduce an electric power by enabling the clock mask when a logical value higher in the probability provided to the scan flip-flop circuit included in each scan chain after the capturing operation is continuously input, on the basis of information on the probability that each scan flip-flop circuit configuring the scan chain becomes the given logical state after the scan chain structuring processing has been executed.

9. A semiconductor device comprising:

a scan flip-flop circuit that can switch between scanning operation and capturing operation, wherein a scan chain is structured for a plurality of scan flip-flop circuits having the same degree of probability that an output value of the scan flip-flop circuit after the capturing operation becomes a given logical state, wherein a maskable mask control logic is included in a logical value higher in the probability after the capturing operation.

10. The semiconductor device according to claim 9, further comprising a scan flip-flop circuit that can reduce an electric power by enabling a clock mask when a logical value higher in the probability after the capturing operation is continuously input.

11. The semiconductor device according to claim 10, further comprising a test point circuit that can control the probability that the output value of the scan flip-flop circuit after the capturing operation becomes the given logical state.

* * * * *